US011158635B2

(12) United States Patent
Shao et al.

(10) Patent No.: US 11,158,635 B2
(45) Date of Patent: Oct. 26, 2021

(54) LOW LEAKAGE GATE STACK FOR A TRANSISTOR DEVICE AND METHODS OF MAKING AN IC PRODUCT THAT INCLUDES SUCH A TRANSISTOR DEVICE

(71) Applicant: GLOBALFOUNDRIES U.S. Inc., Santa Clara, CA (US)

(72) Inventors: Dali Shao, Mechanicville, NY (US); Tao Chu, Portland, OR (US); Liqiao Qin, Loudonville, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/832,139

(22) Filed: Mar. 27, 2020

(65) Prior Publication Data

US 2021/0305251 A1  Sep. 30, 2021

(51) Int. Cl.
*H01L 21/28* (2006.01)
*H01L 21/8238* (2006.01)
*H01L 27/092* (2006.01)
*H01L 29/49* (2006.01)

(52) U.S. Cl.
CPC .... *H01L 27/0922* (2013.01); *H01L 21/28088* (2013.01); *H01L 21/823842* (2013.01); *H01L 29/4966* (2013.01)

(58) Field of Classification Search
CPC .......... H01L 27/0922; H01L 21/28088; H01L 21/823842; H01L 29/4966
USPC ........................................................ 257/369
See application file for complete search history.

(56) References Cited

U.S. PATENT DOCUMENTS

| 6,511,911 | B1 | 1/2003 | Besser et al. |
| 6,664,604 | B1 | 12/2003 | Besser et al. |
| 2012/0273902 | A1 | 11/2012 | Lin et al. |
| 2018/0026112 | A1 | 1/2018 | Park et al. |
| 2018/0151575 | A1* | 5/2018 | Li .................. H01L 21/823842 |

* cited by examiner

*Primary Examiner* — Tong-Ho Kim
(74) *Attorney, Agent, or Firm* — Hoffman Warnick LLC

(57) ABSTRACT

One illustrative IC product disclosed herein includes a semiconductor substrate and a first transistor device formed on the semiconductor substrate. The first transistor device comprises a first gate structure. The first gate structure comprises a gate insulation layer, a first layer of titanium nitride (TiN) positioned above the gate insulation layer, a layer of titanium silicon nitride (TiSiN) positioned above the first layer of TiN and a second layer of titanium nitride (TiN) positioned above the layer of TiSiN.

20 Claims, 20 Drawing Sheets

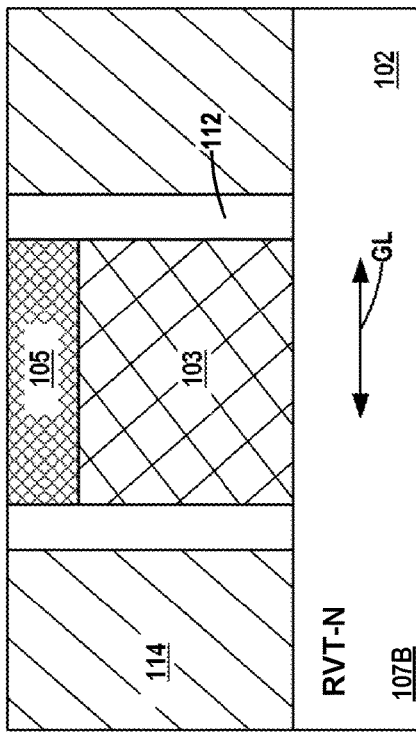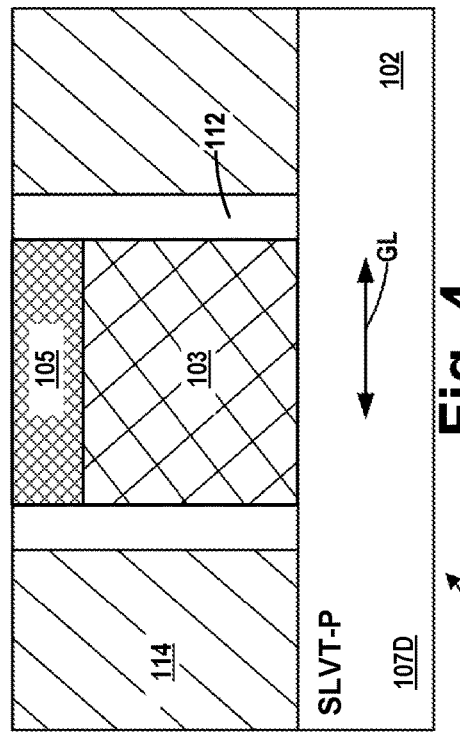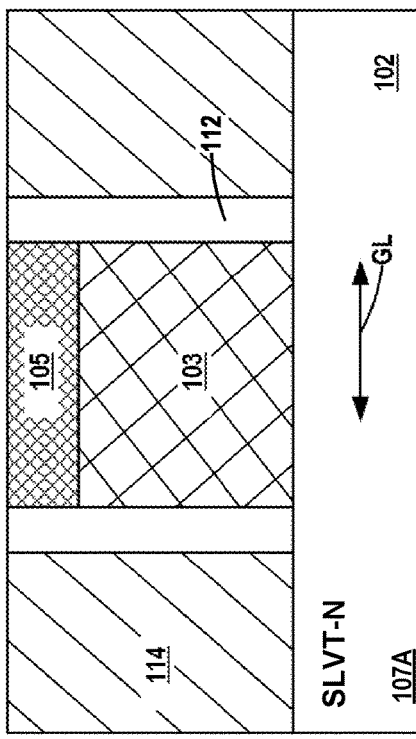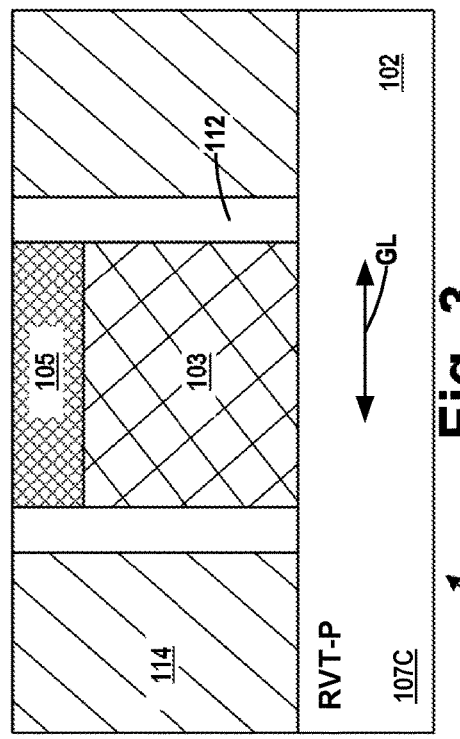

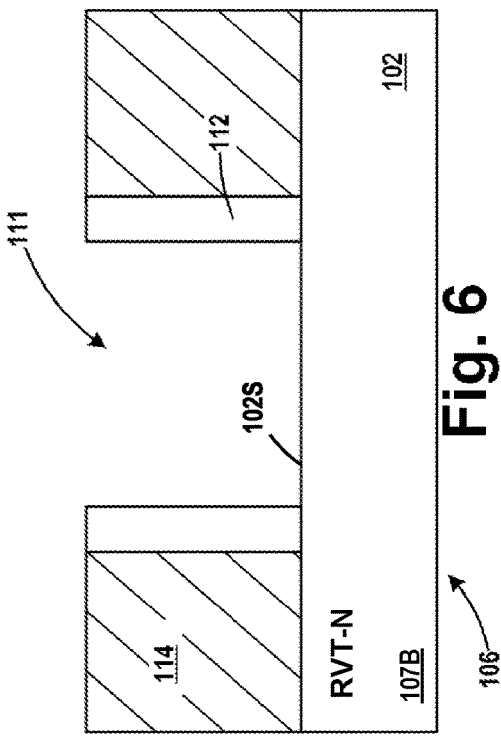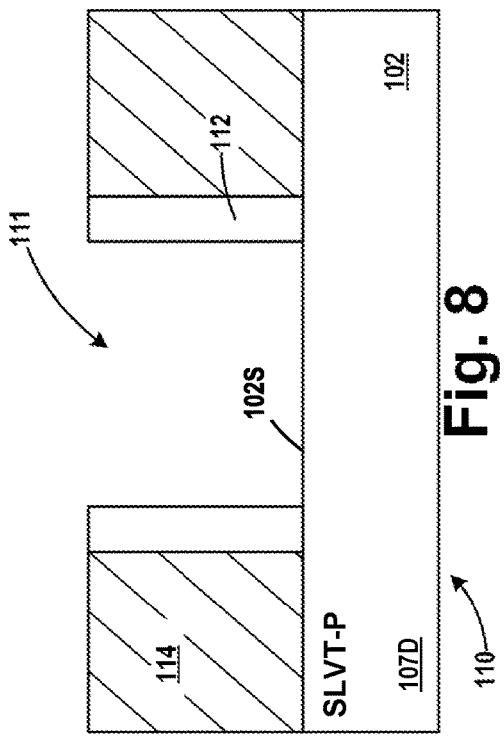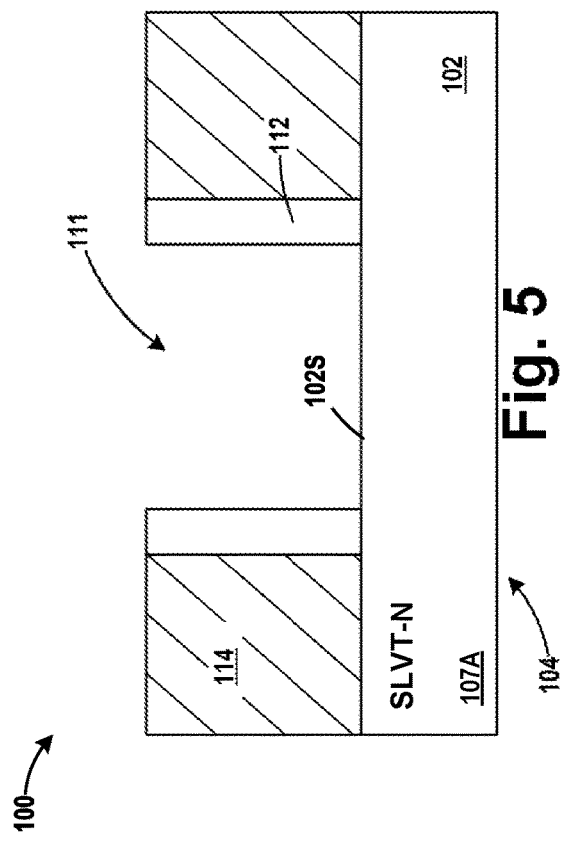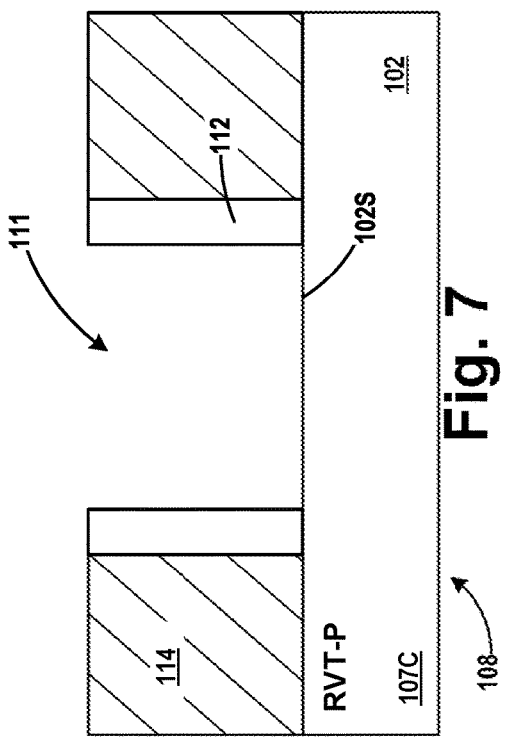

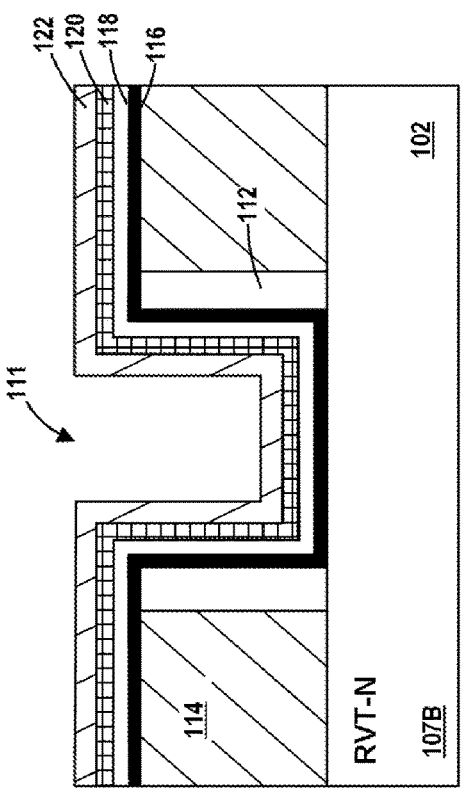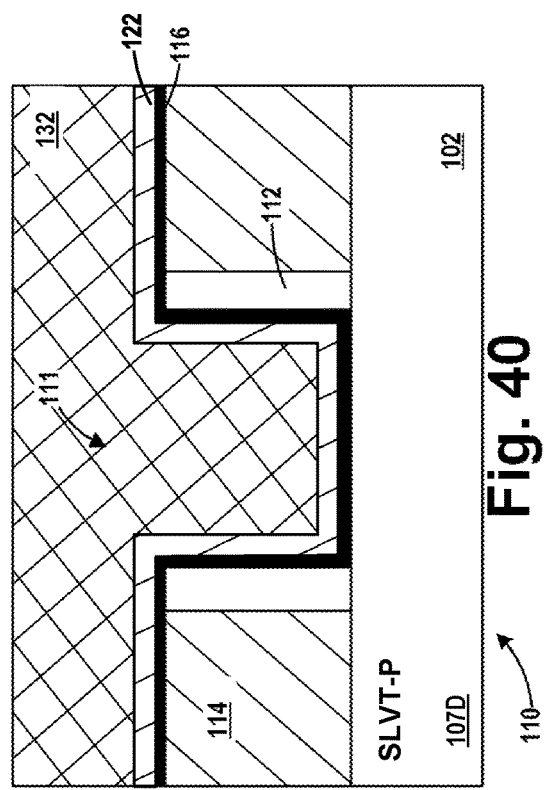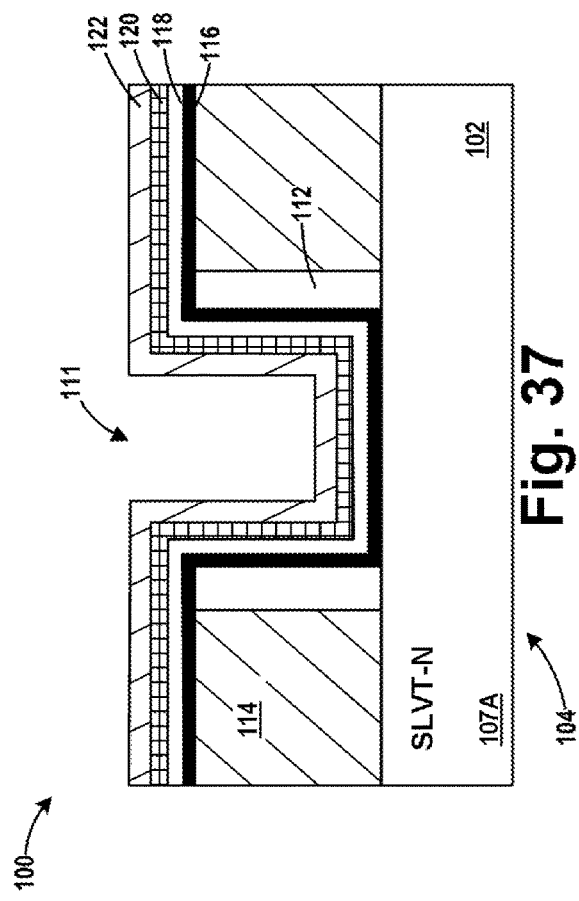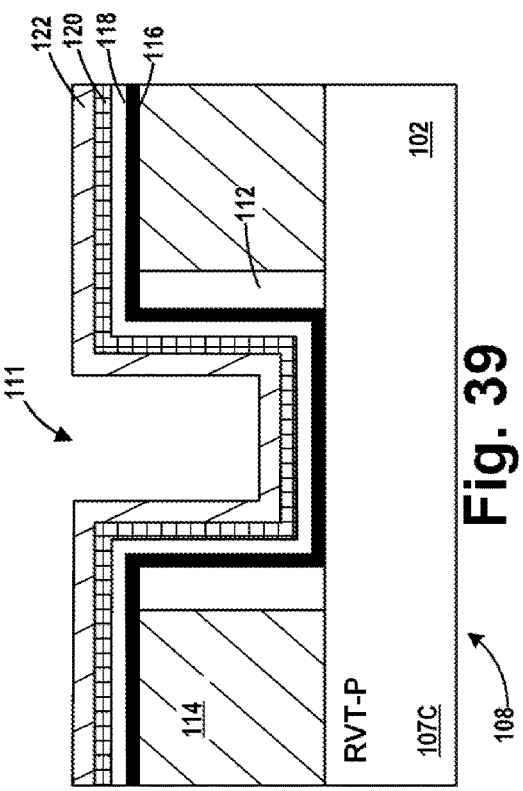

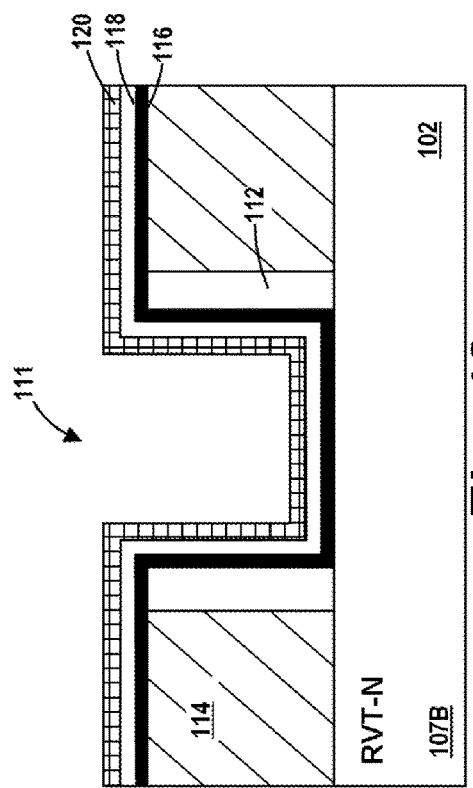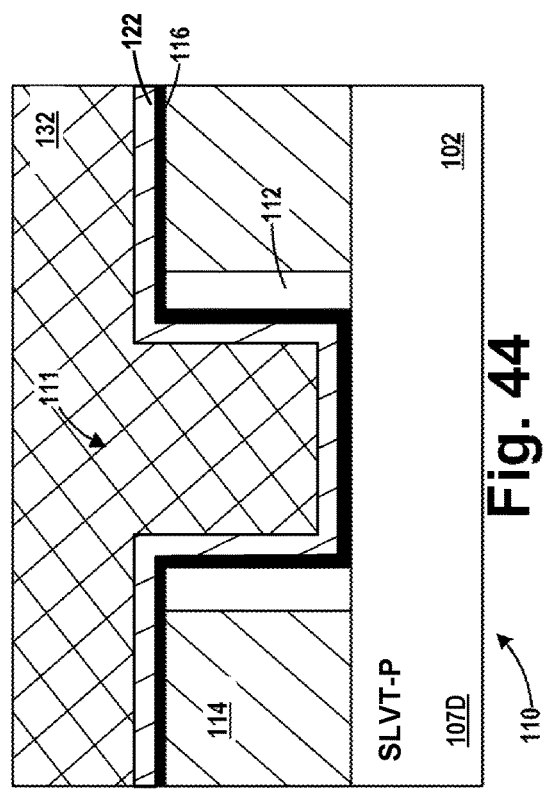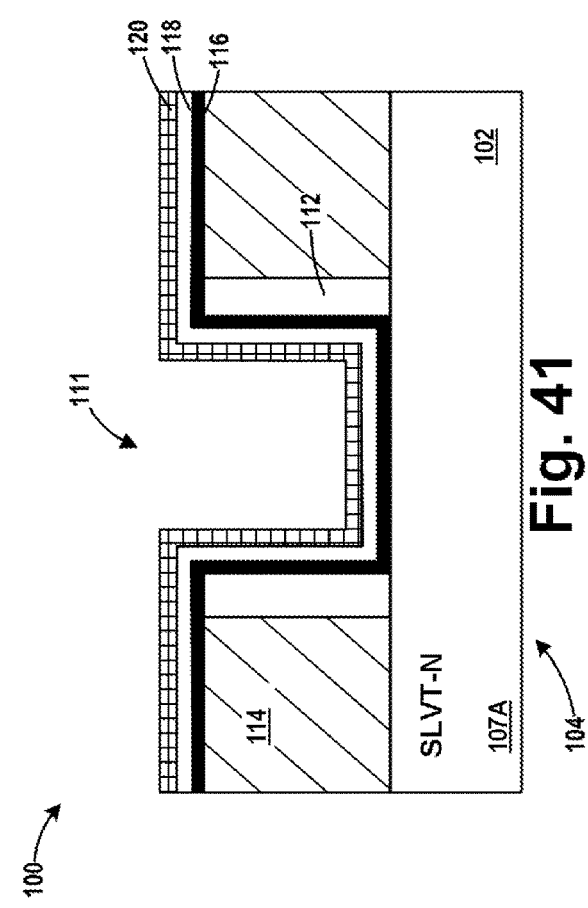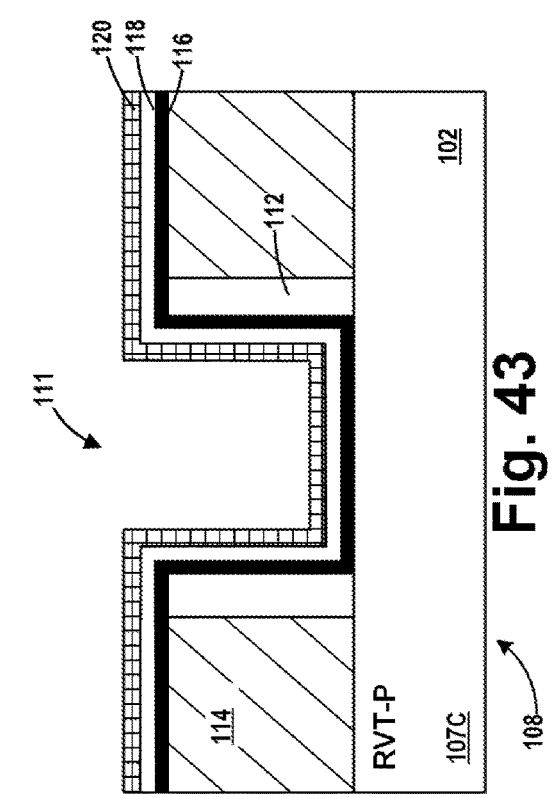
Fig. 41
Fig. 42
Fig. 43
Fig. 44

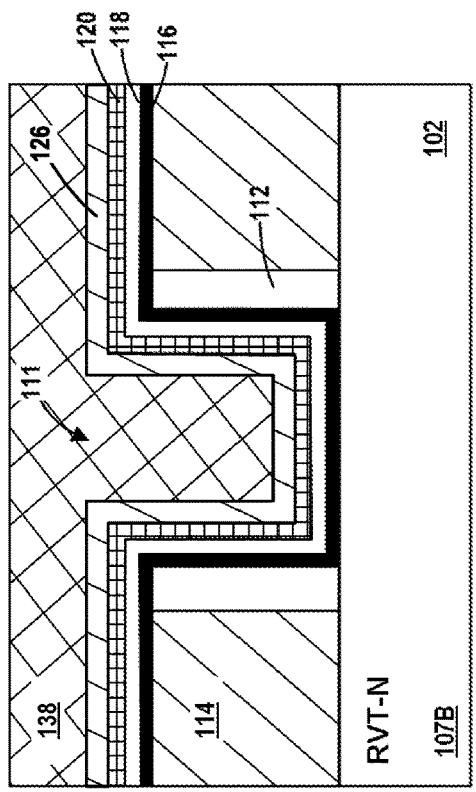
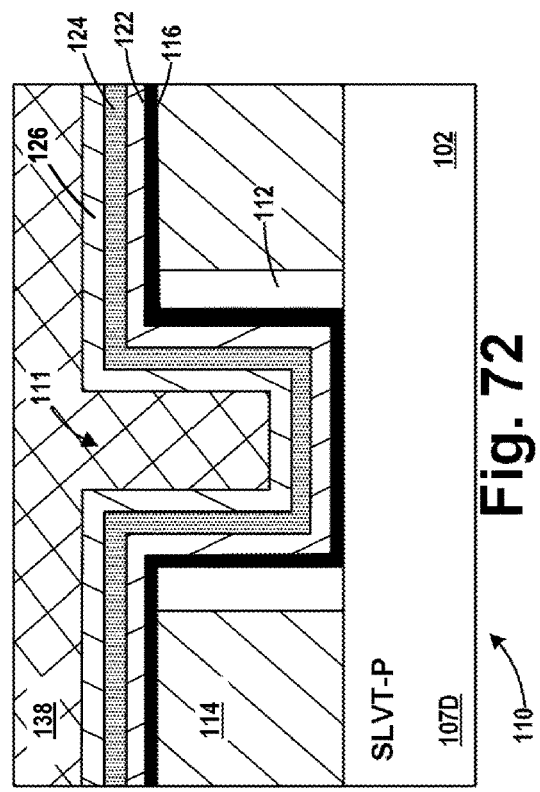
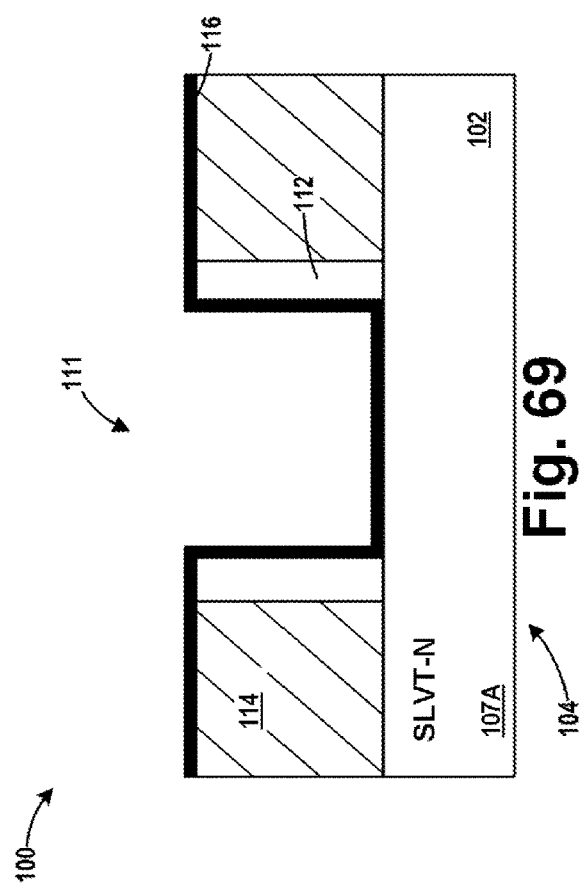
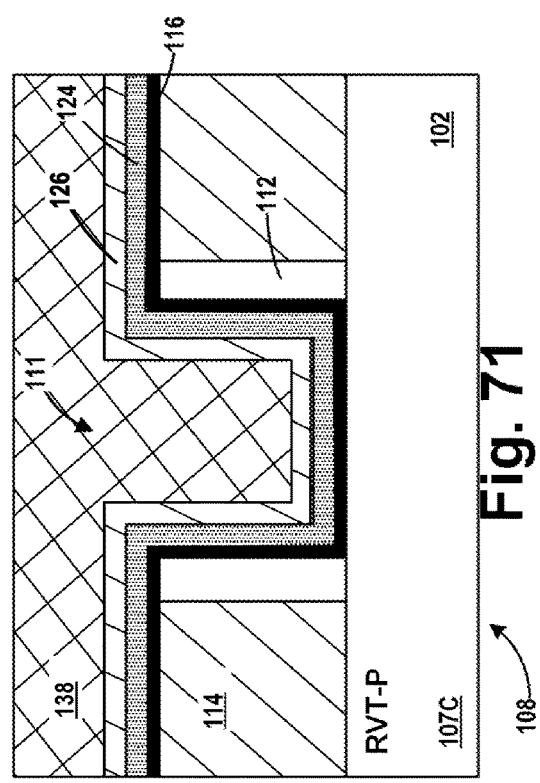

LOW LEAKAGE GATE STACK FOR A TRANSISTOR DEVICE AND METHODS OF MAKING AN IC PRODUCT THAT INCLUDES SUCH A TRANSISTOR DEVICE

BACKGROUND OF THE INVENTION

Field of the Invention

The present disclosure generally relates to the fabrication of integrated circuits, and, more particularly, to various novel embodiments of a low leakage gate stack for a transistor device and various novel methods of making an integrated circuit (IC) product that includes such a transistor device.

Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NFET or PFET type devices wherein the "N" and "P" designation is based upon the type of dopants used to create the source/drain regions of the devices.

The threshold voltage (Vt) of a transistor is the voltage that is required to turn the transistor "ON." In general, transistor devices with relatively lower threshold voltage levels will exhibit relatively faster performance, e.g., faster ON-OFF switching speed, and relatively greater off-state leakage currents, which may lead to greater power consumption. Conversely, transistor devices with relatively higher threshold voltage levels will exhibit relatively slower performance, e.g., slower ON-OFF switching speed, but relatively lower off-state leakage currents, which may result in reduced power consumption. Thus, IC products may be formed with transistors having different threshold voltages in an effort to optimize the power and performance of IC products. This optimization has become increasingly important for mobile devices wherein it is desired to have high performance and low power consumption so as to increase battery life. The number of different threshold voltage classes available for use on an IC product has proliferated so as to assist product designers to meet these objectives. These different classes of transistor devices may be categorized as, for example, super low threshold voltage (SLVT) devices, low threshold voltage (LVT) devices, regular threshold voltage (RVT) devices or high threshold voltage (HVT) devices, etc. Where once it was typical to design an IC product using one or two different classes of threshold voltage transistors, more recent products may include four or even five different classes of threshold voltages. Multiple threshold voltage devices allow designers to select the best option for each section of a design, trading-off power and performance. In mobile applications, e.g., cell phones, tablets, personal devices, it is highly desirable to reduce the power consumption of the IC product in both on-state and off-state conditions so as to conserve battery life.

The present disclosure is generally directed to various novel embodiments of a low leakage gate stack for a transistor device and various novel methods of making an IC product that includes such a transistor device that may at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel embodiments of a low leakage gate stack for a transistor device and various novel methods of making an IC product that includes such a transistor device. One illustrative IC product disclosed herein includes a semiconductor substrate and a first transistor device formed on the semiconductor substrate. The first transistor device comprises a first gate structure. The first gate structure comprises a gate insulation layer, a first layer of titanium nitride (TiN) positioned above the gate insulation layer, a layer of titanium silicon nitride (TiSiN) positioned above the first layer of TiN and a second layer of titanium nitride (TiN) positioned above the layer of TiSiN.

One illustrative method disclosed herein includes forming a first gate structure for a first transistor device by forming a high-k gate insulation layer above an upper surface of a semiconductor substrate, forming a first layer of titanium nitride (TiN) on the high-k gate insulation layer, forming a layer of titanium silicon nitride (TiSiN) on the first layer of TiN and forming a second layer of titanium nitride (TiN) of the layer of TiSiN.

BRIEF DESCRIPTION OF THE DRAWINGS

The disclosure may be understood by reference to the following description taken in conjunction with the accompanying drawings, in which like reference numerals identify like elements, and in which:

FIGS. 1-80 depict various novel embodiments of a low leakage gate stack for a transistor device and various novel methods of making an IC product that includes such a transistor device. The drawings are not to scale.

Figure 9:
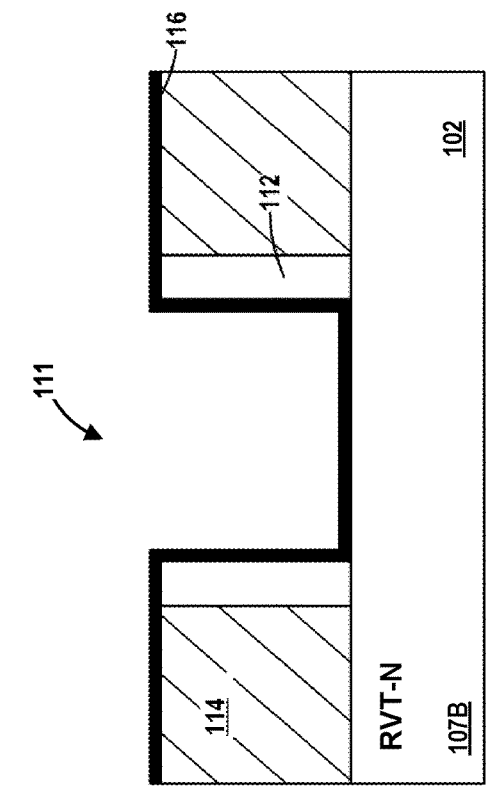
Figure 10:
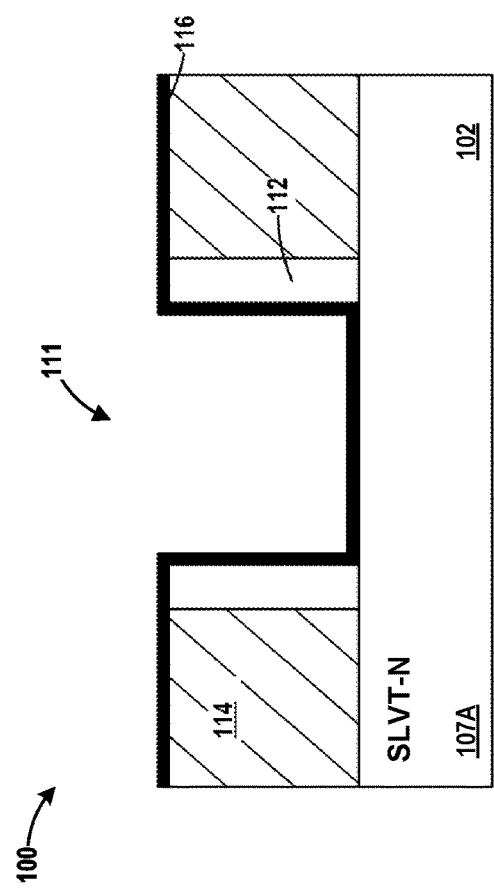
Figure 11:
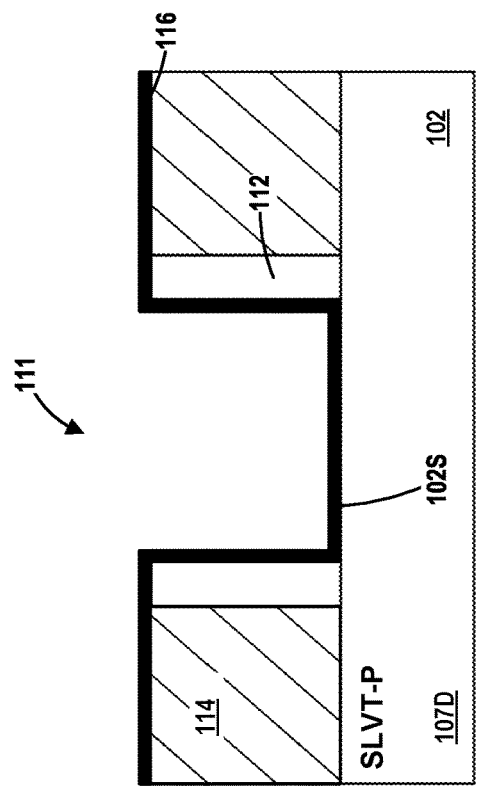
Figure 12:
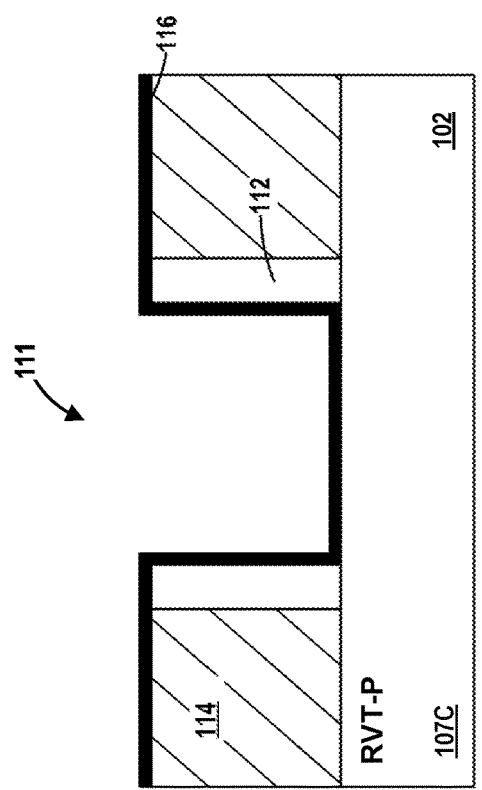
Figure 13:
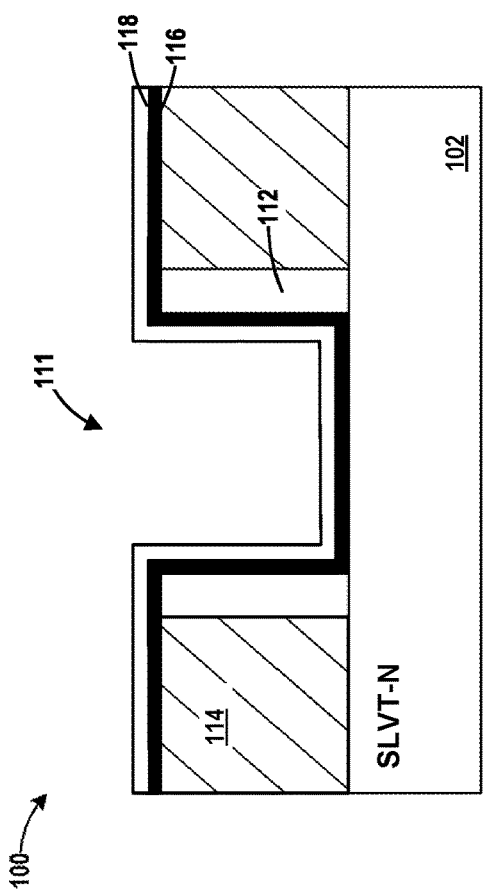
Figure 14:
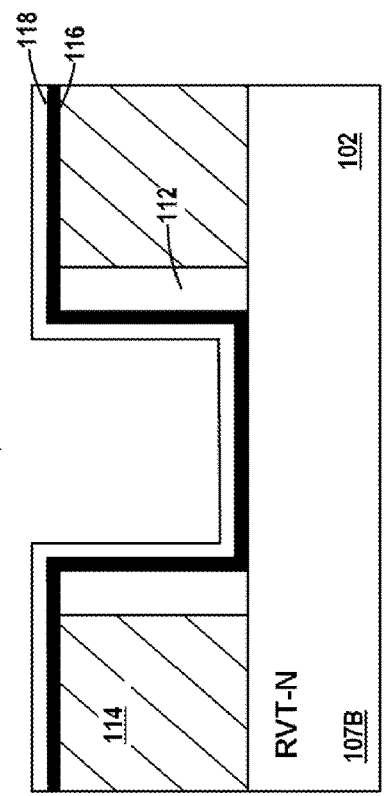
Figure 15:
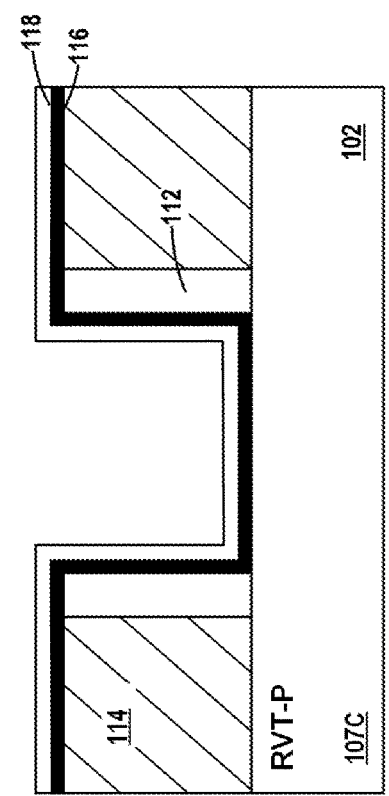
Figure 16:
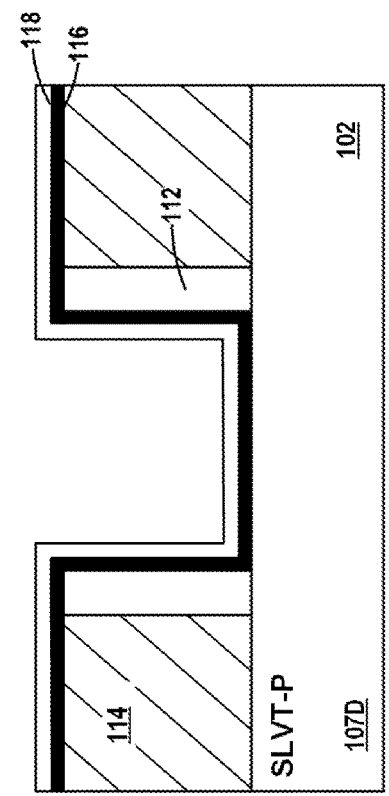
Figure 17:
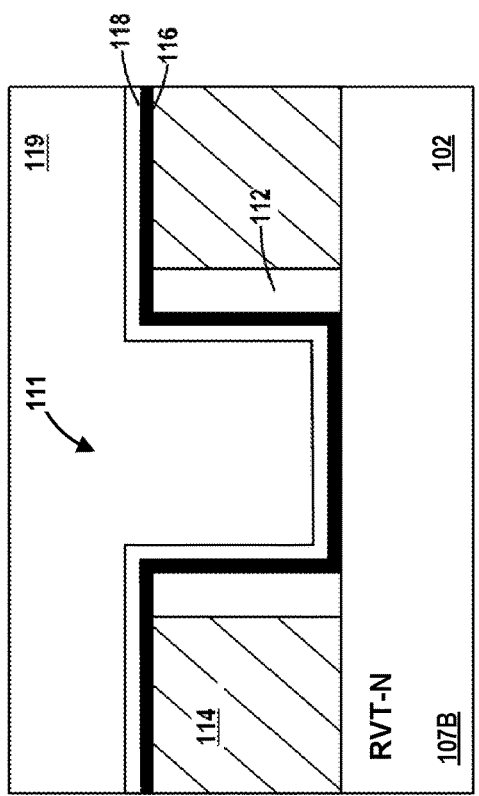
Figure 18:
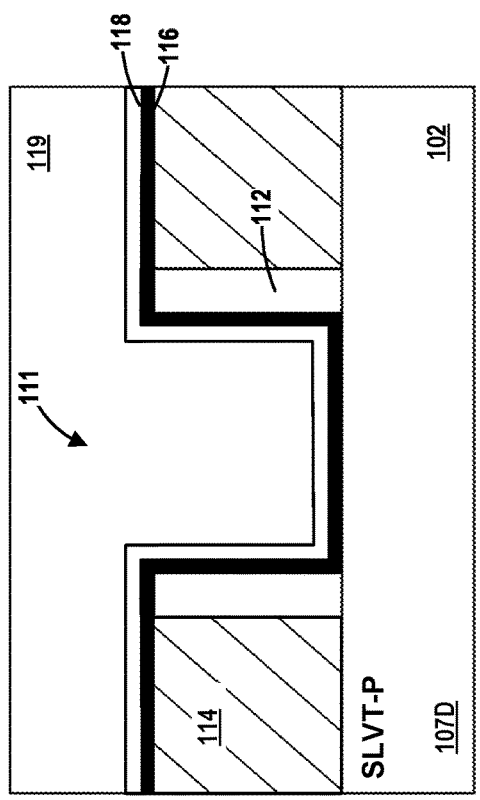
Figure 19:
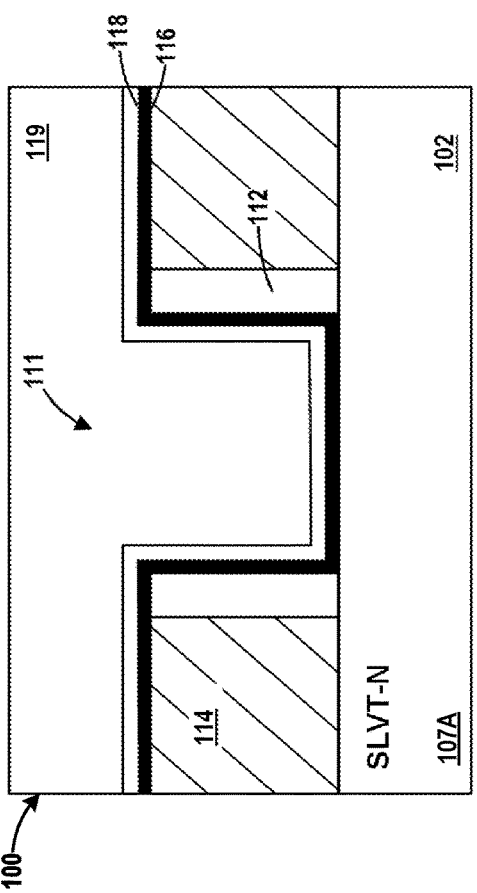
Figure 20:
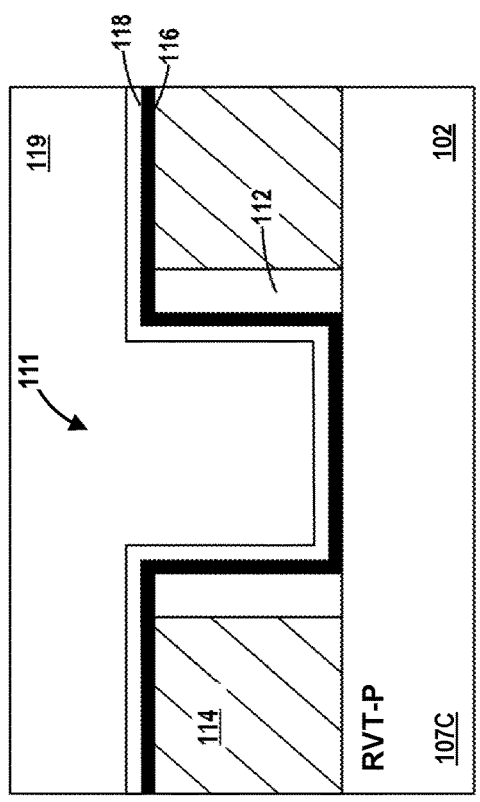
Figure 21:
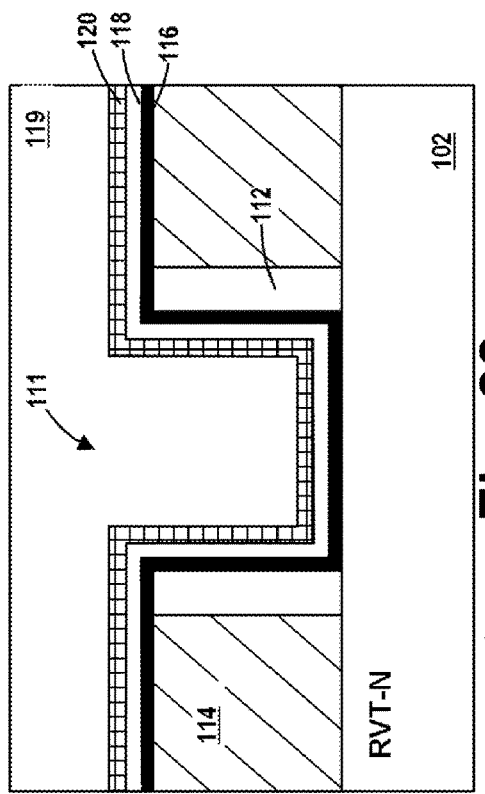
Figure 22:
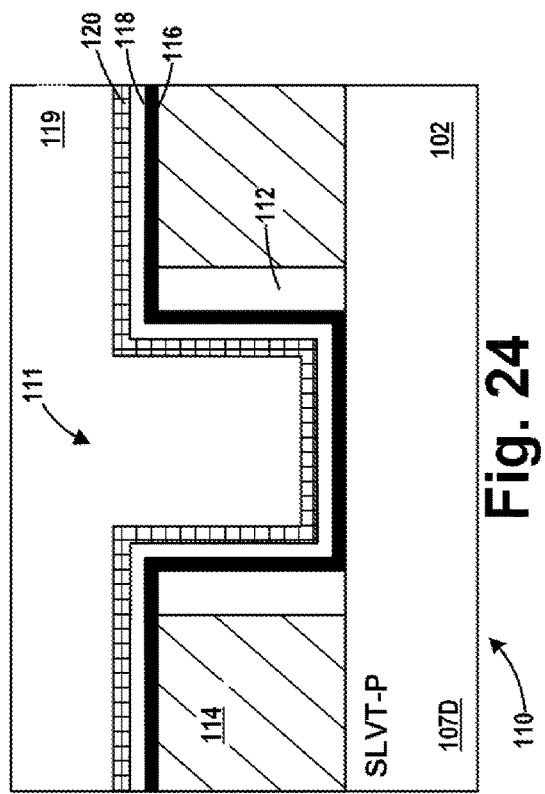
Figure 23:
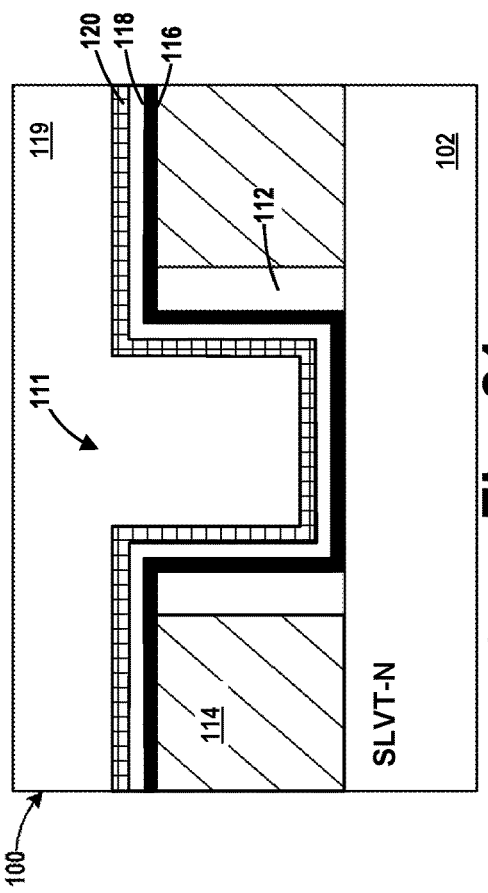
Figure 24:
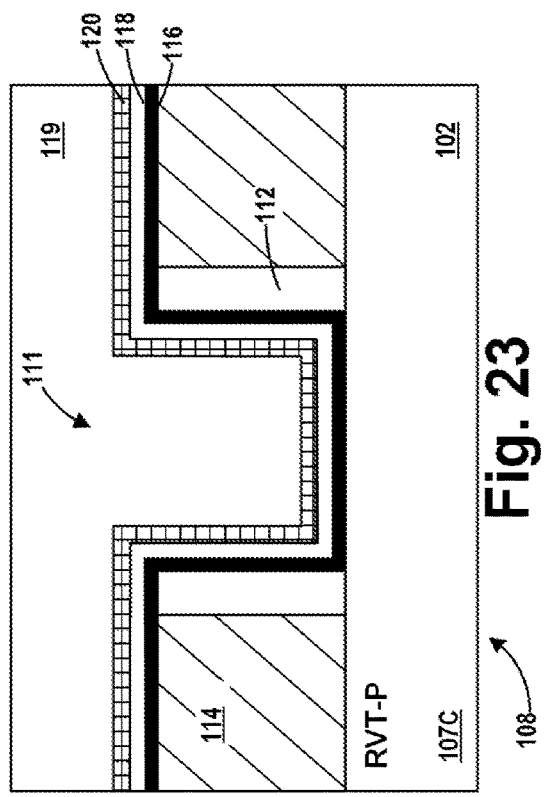
Figure 25:
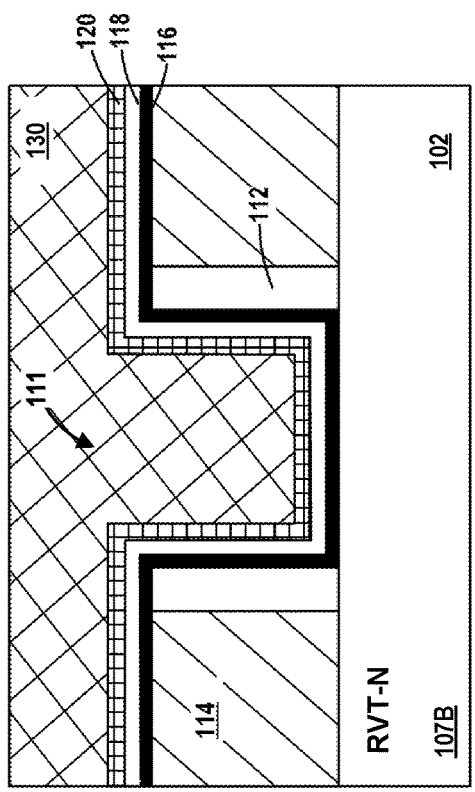
Figure 26:
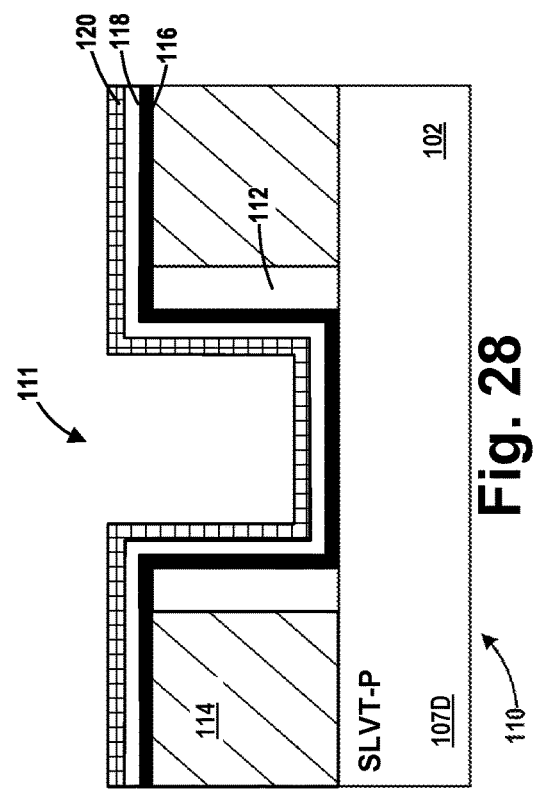
Figure 27:
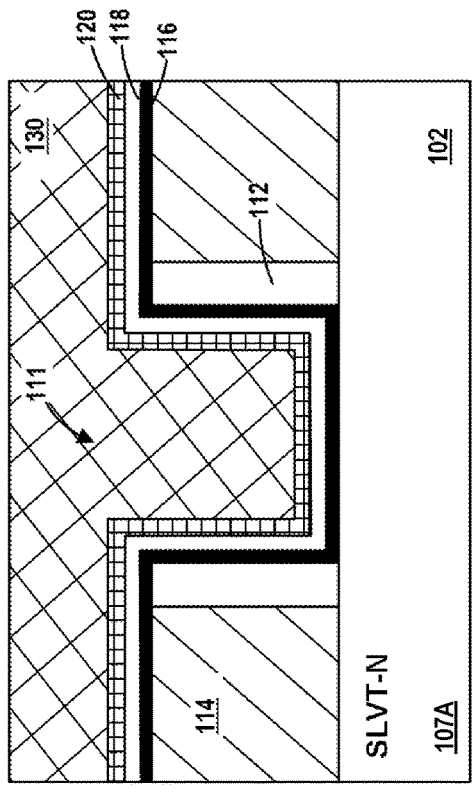
Figure 28:
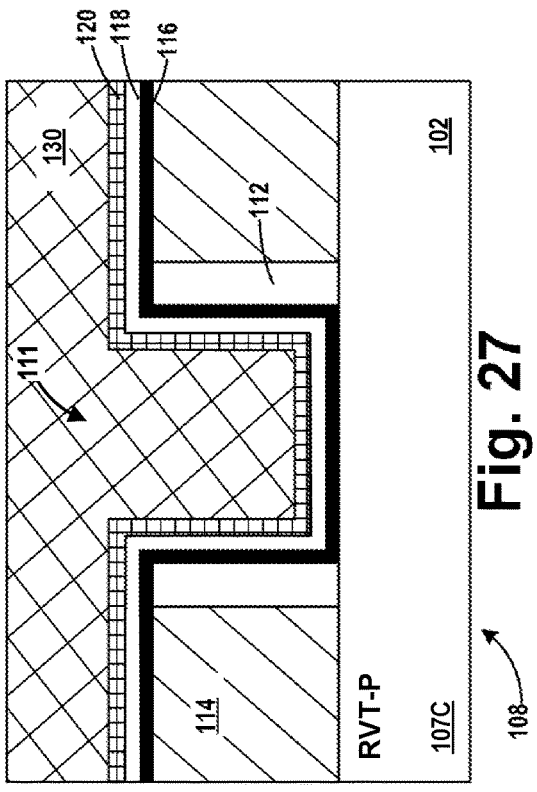
Figure 29:
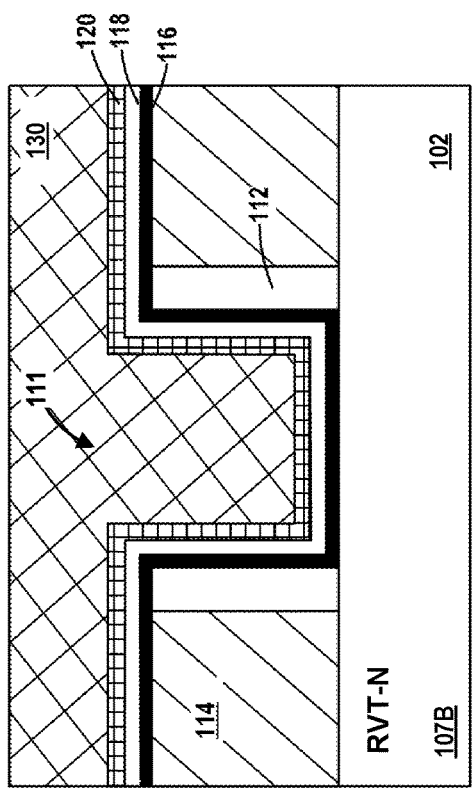
Figure 30:
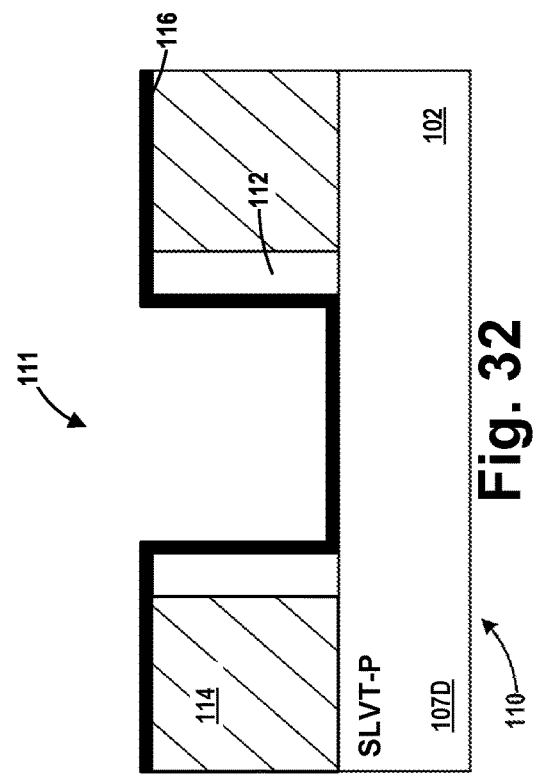
Figure 31:
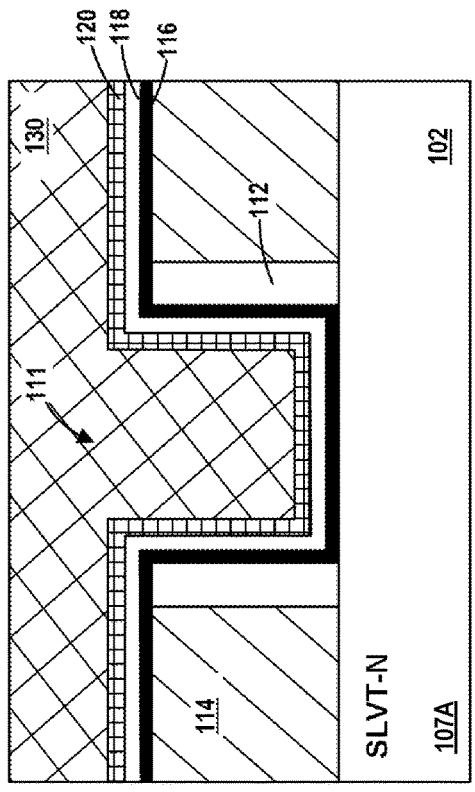
Figure 32:
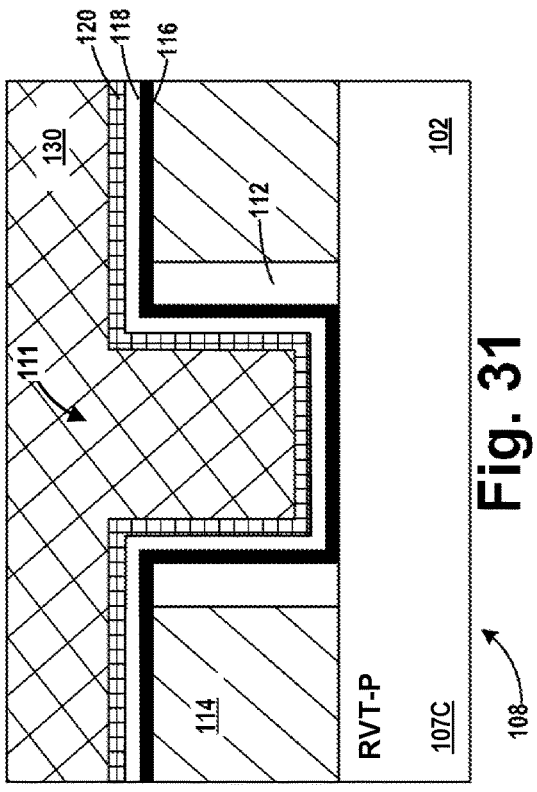
Figure 33:
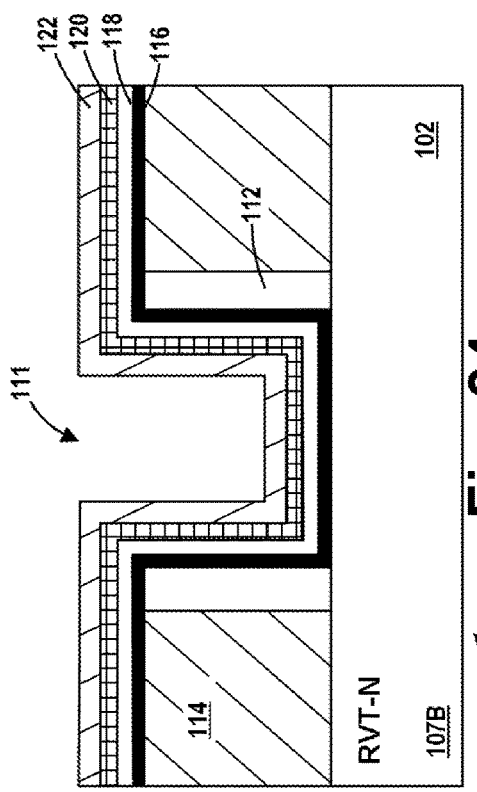
Figure 34:
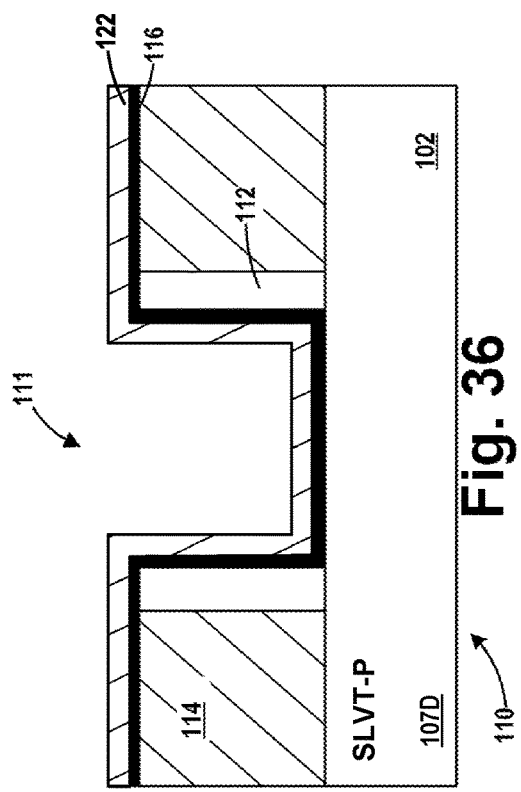
Figure 35:
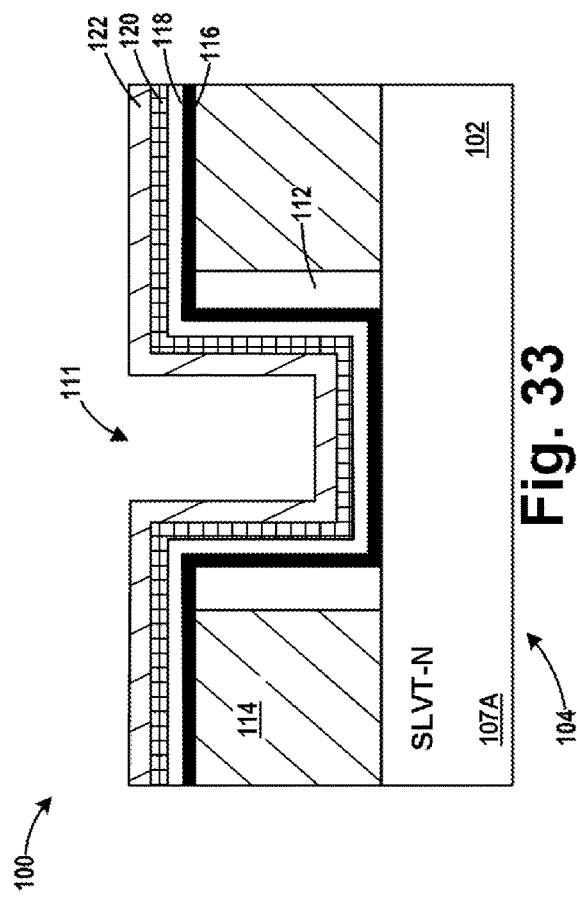
Figure 36:
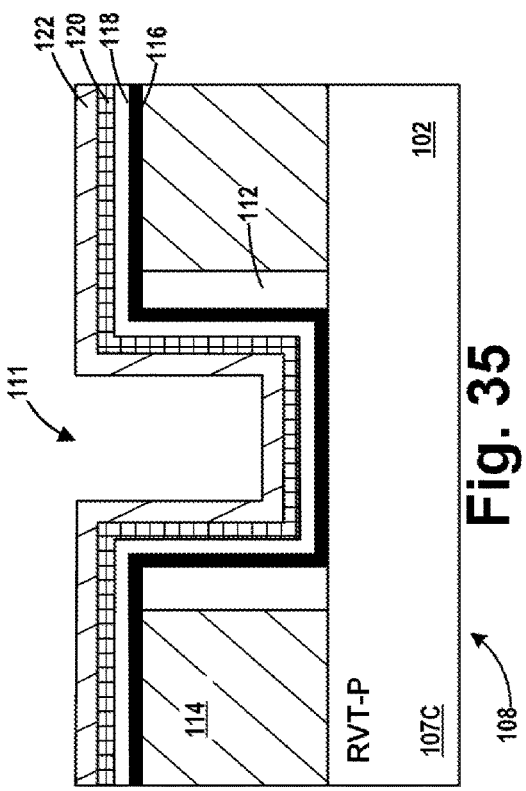
Figure 45:
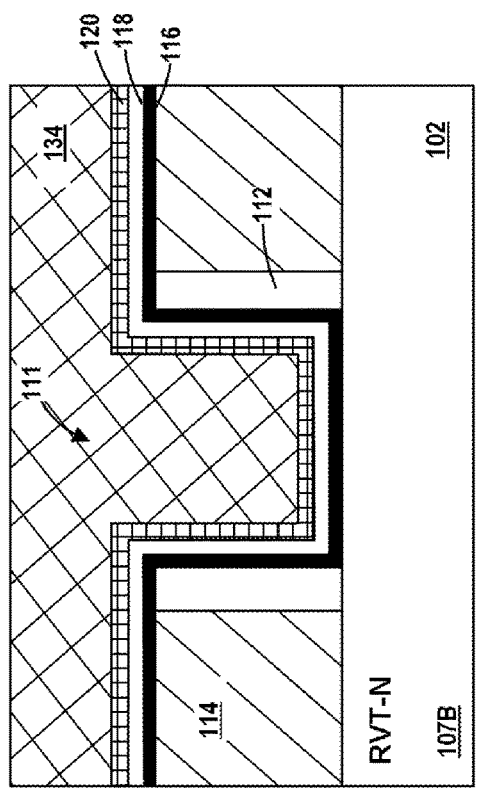
Figure 46:
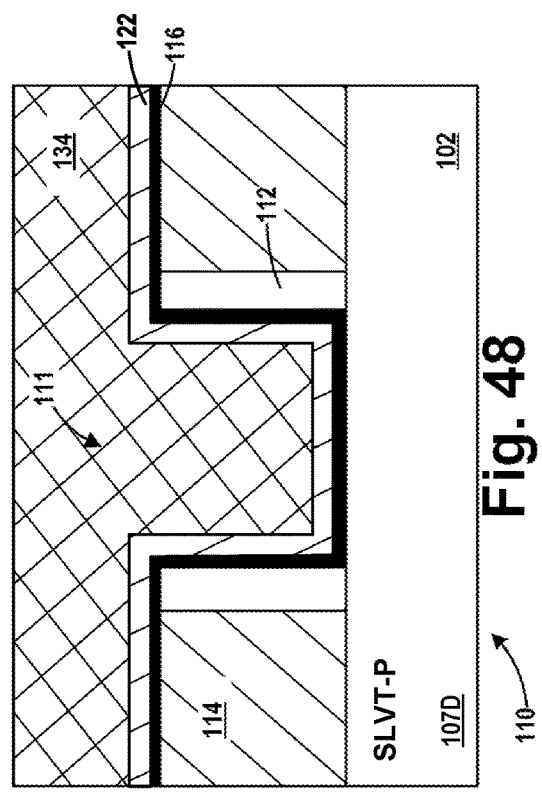
Figure 47:
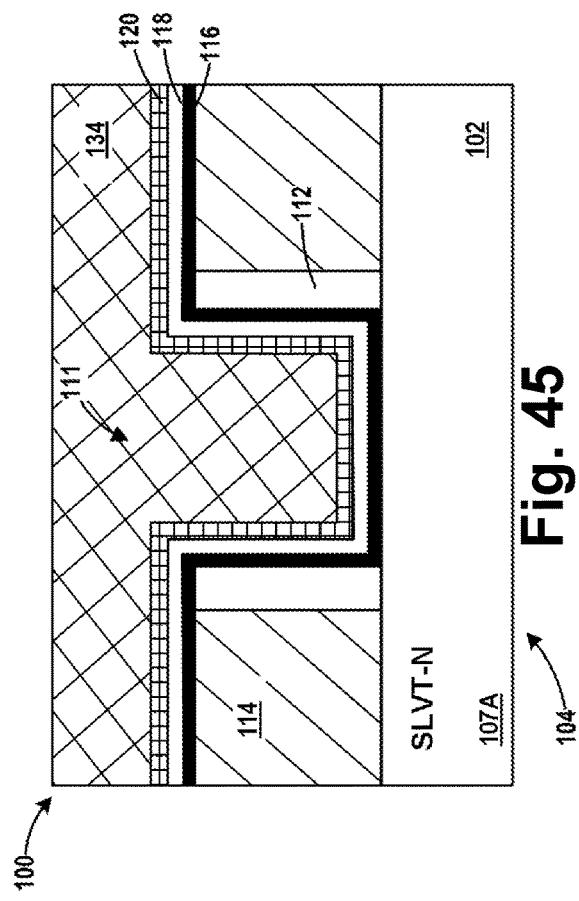
Figure 48:
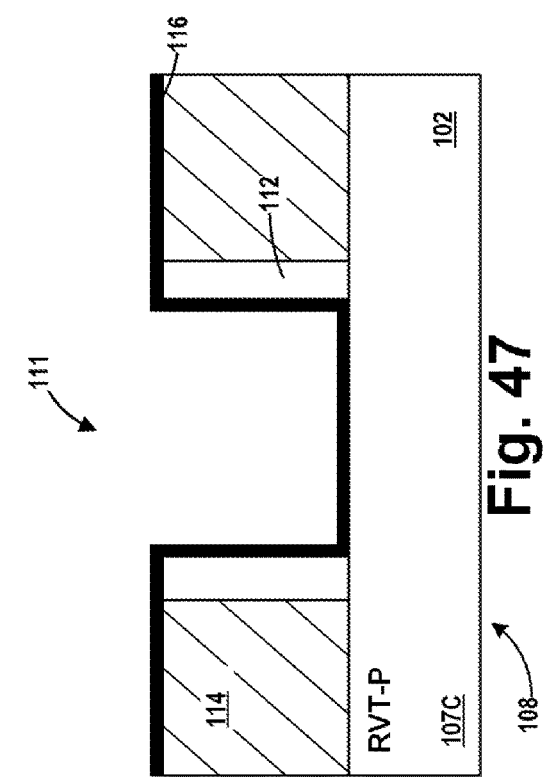
Figure 49:
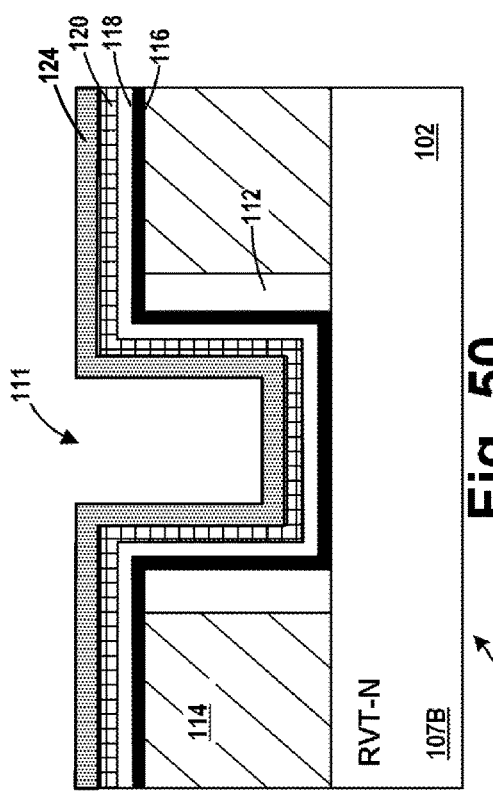
Figure 50:
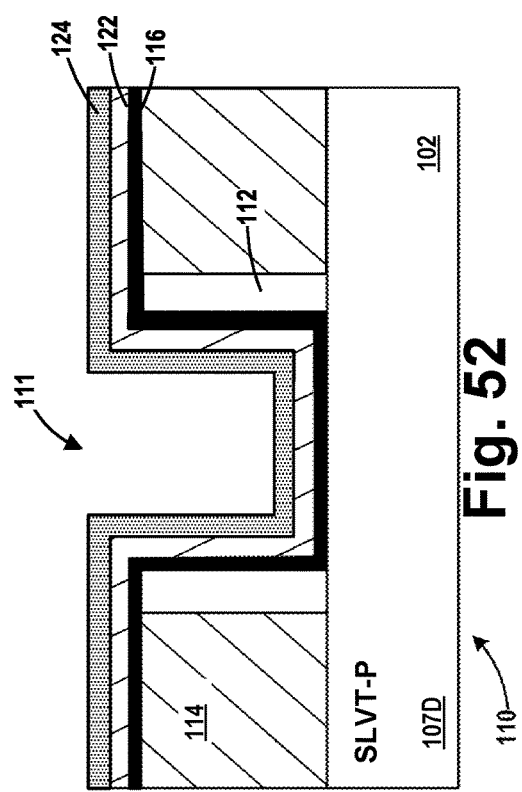
Figure 51:
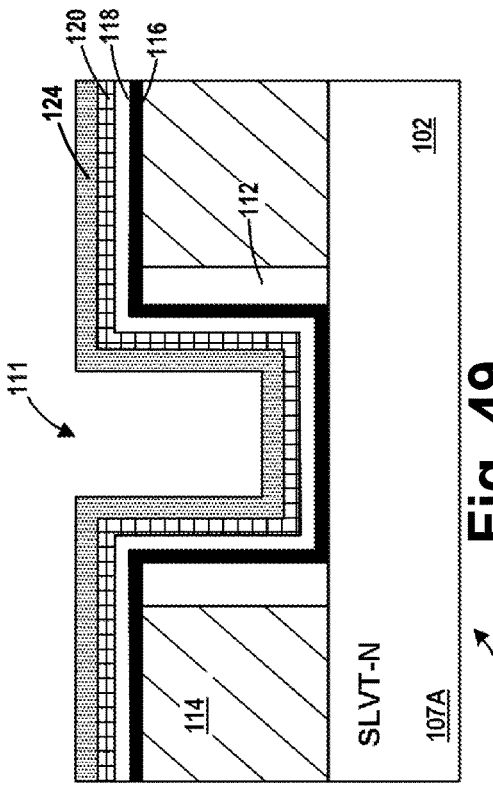
Figure 52:
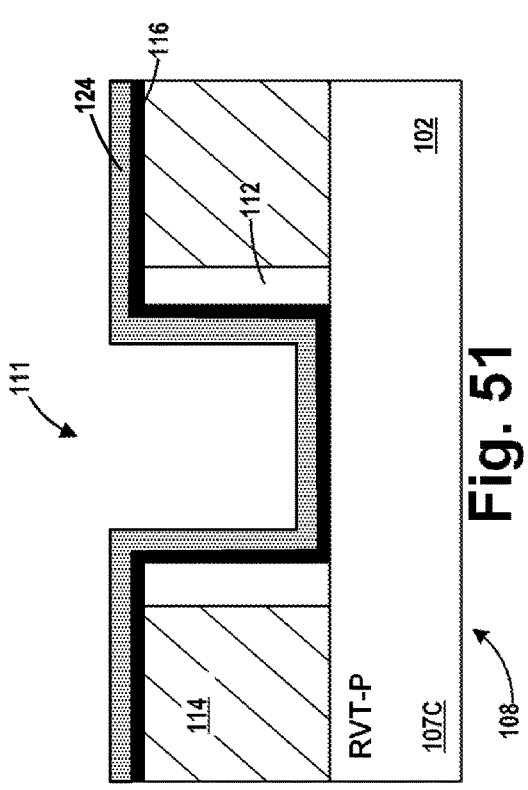
Figure 54:
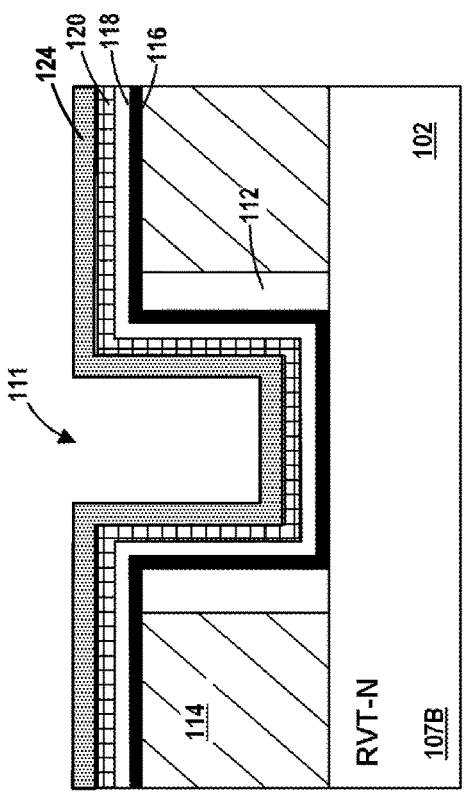
Figure 56:
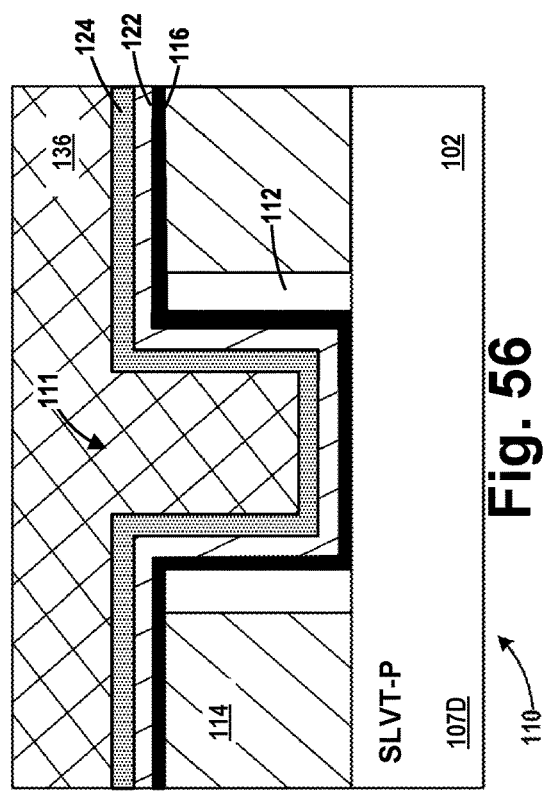
Figure 53:
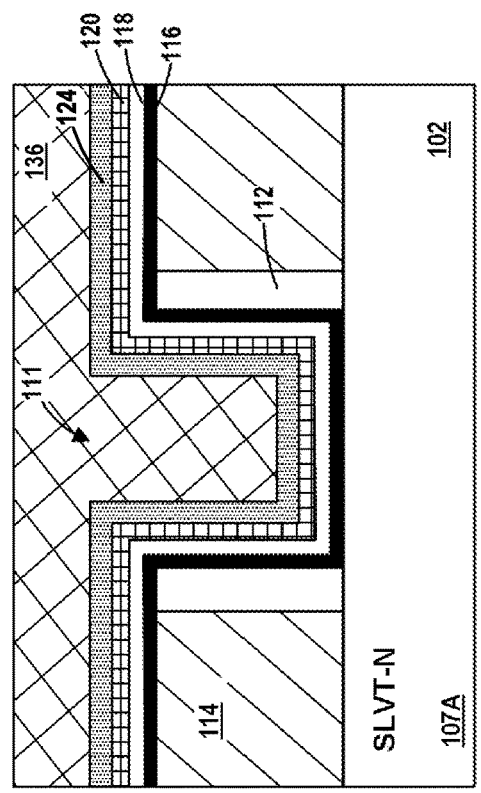
Figure 55:
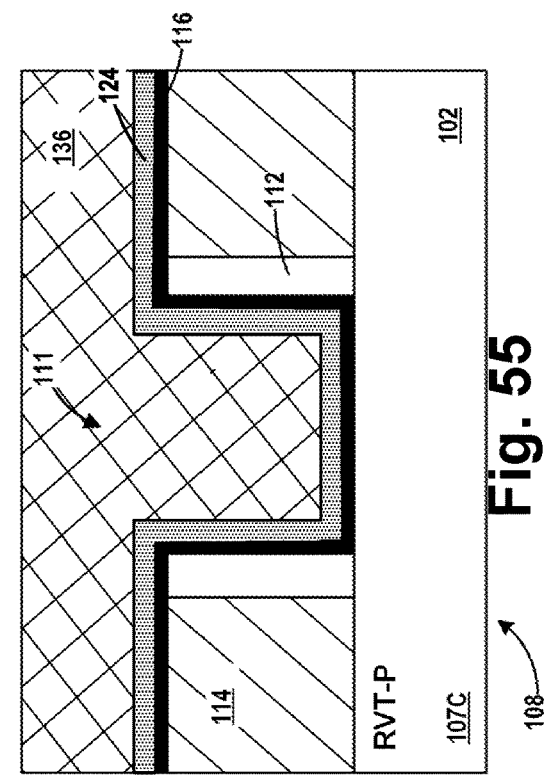
Figure 57:
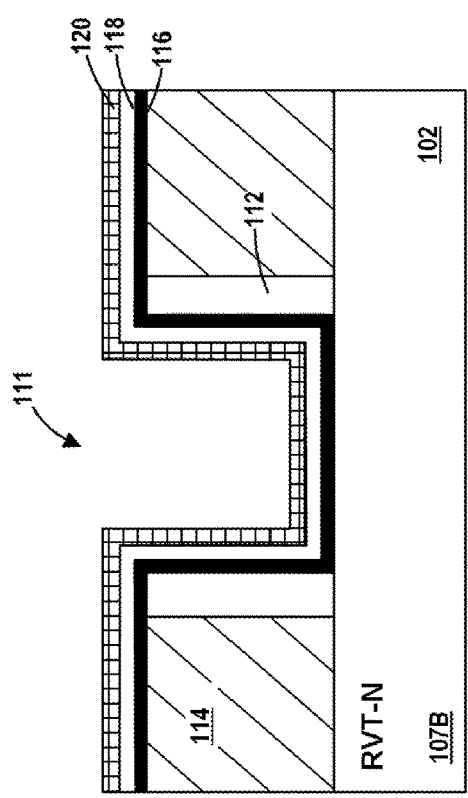
Figure 58:
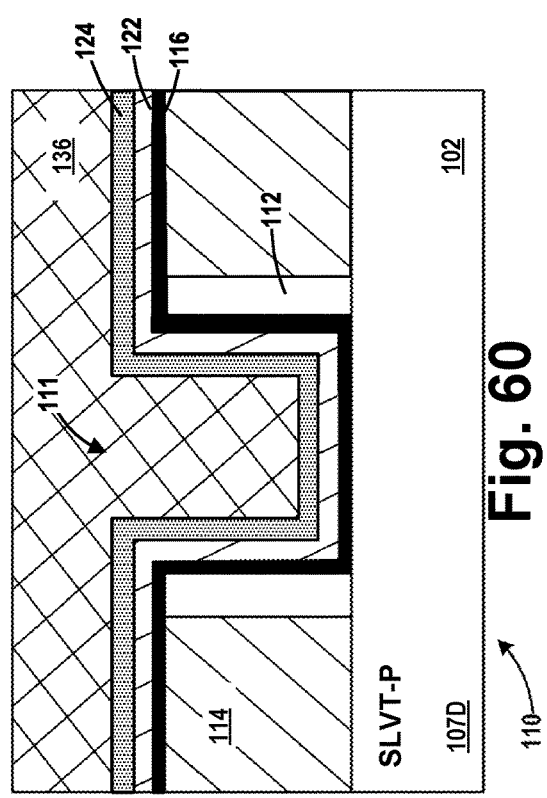
Figure 59:
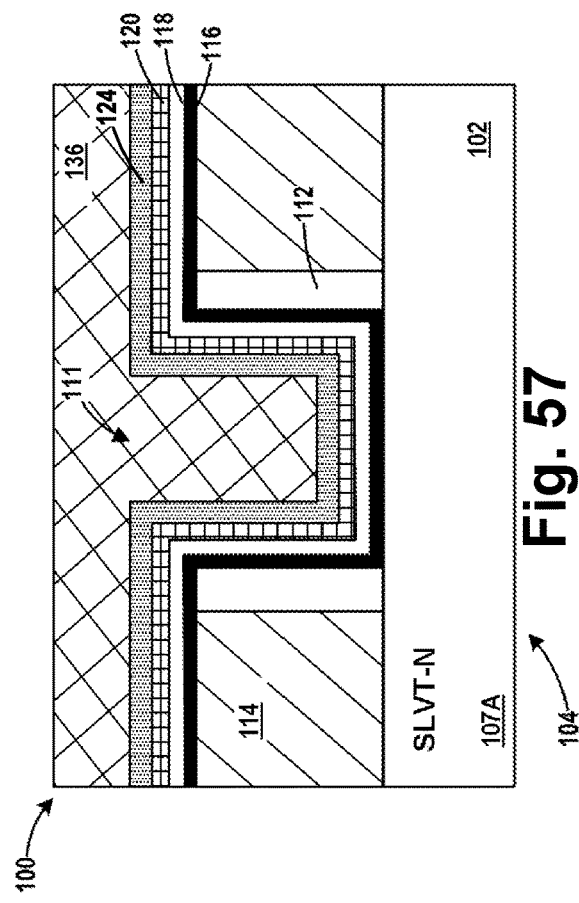
Figure 60:
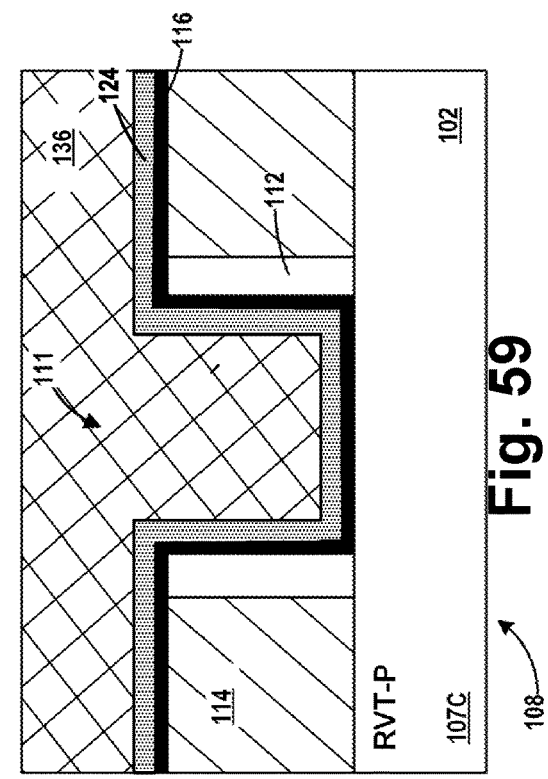
Figure 61:
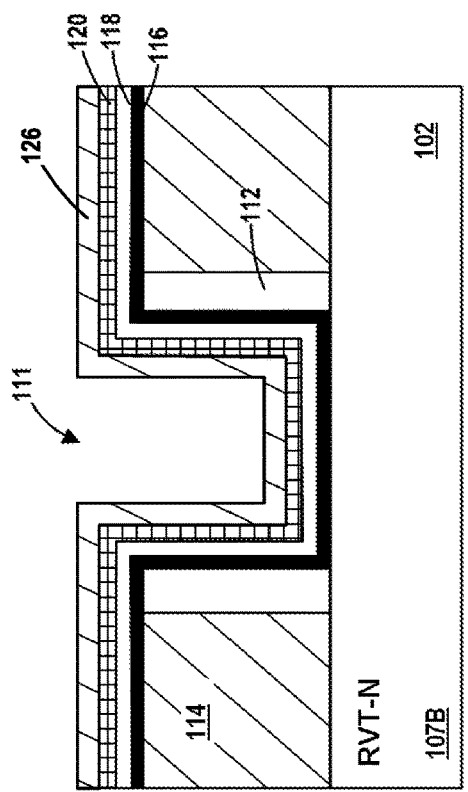
Figure 62:
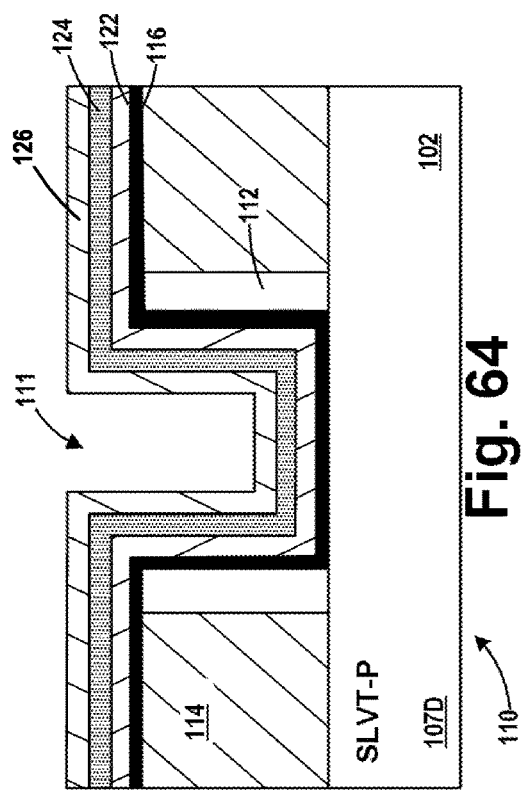
Figure 63:
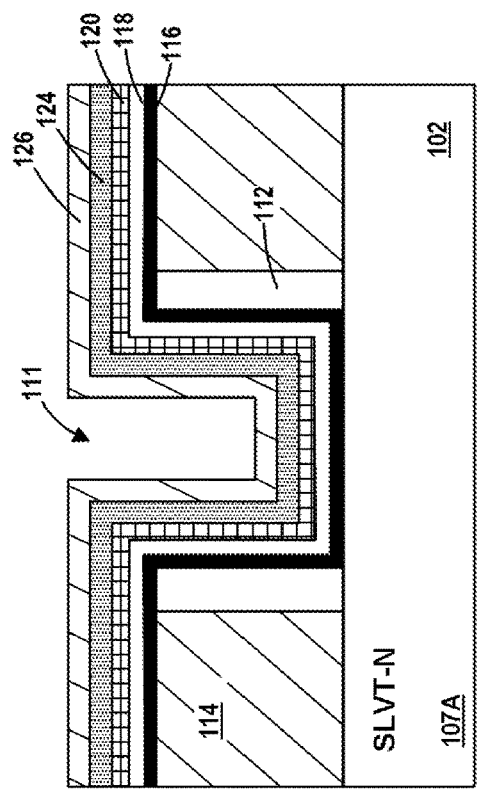
Figure 64:
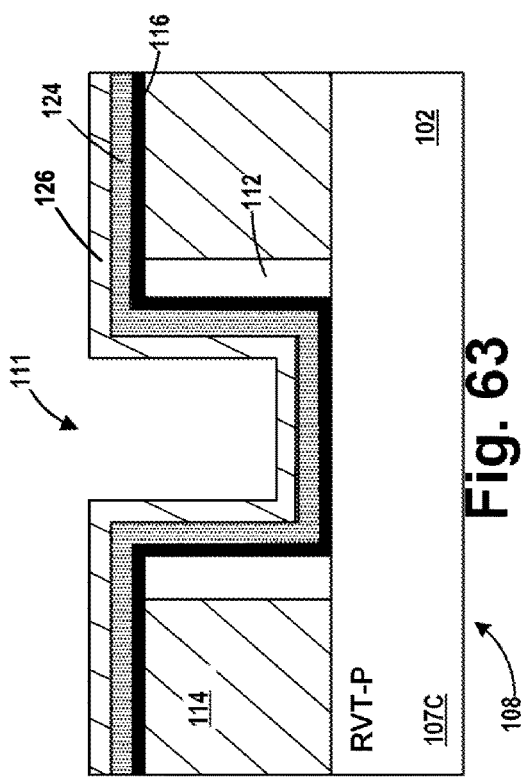
Figure 65:
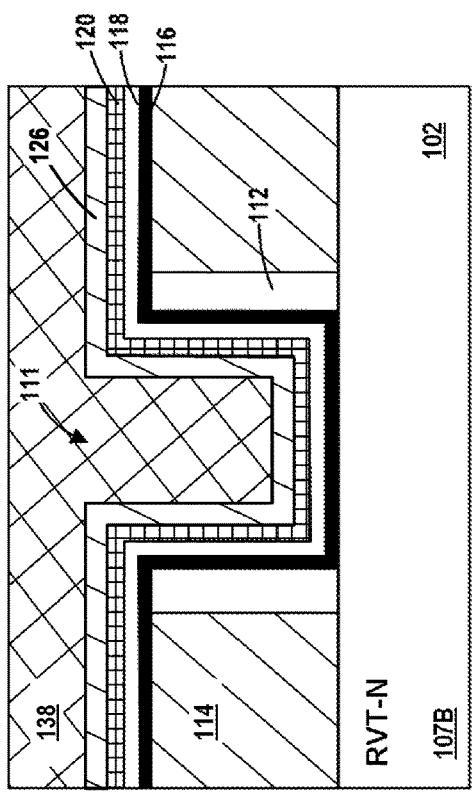
Figure 66:
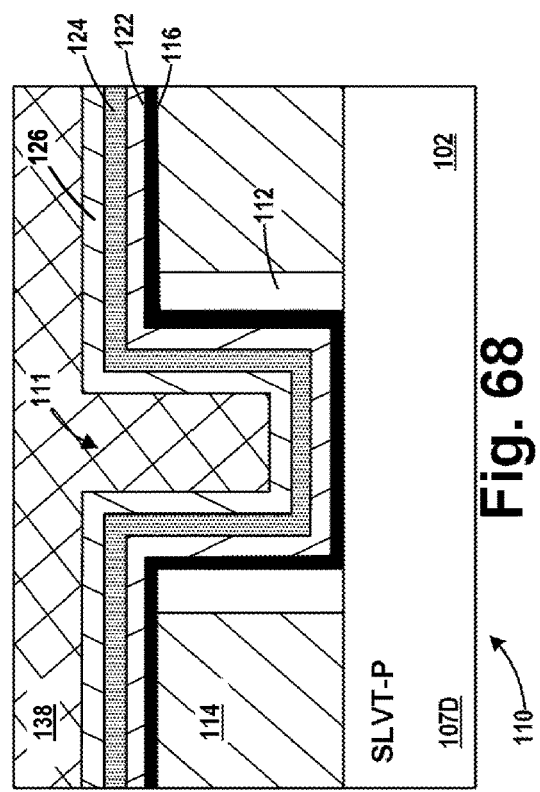
Figure 67:
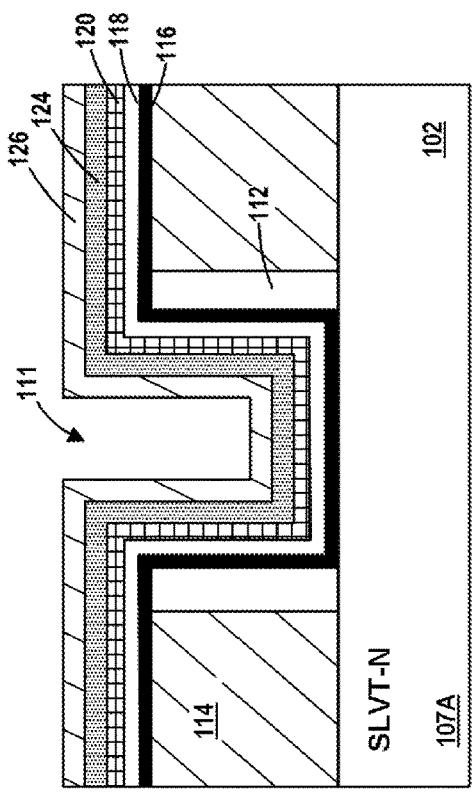
Figure 68:
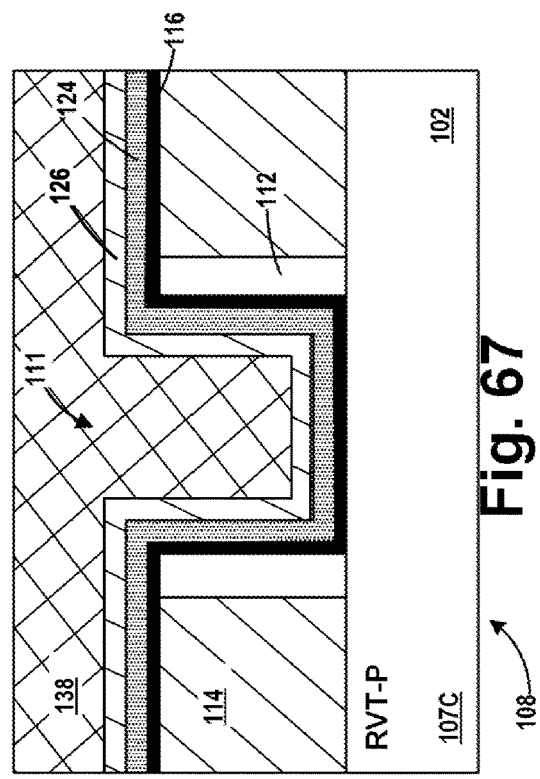
Figure 74:
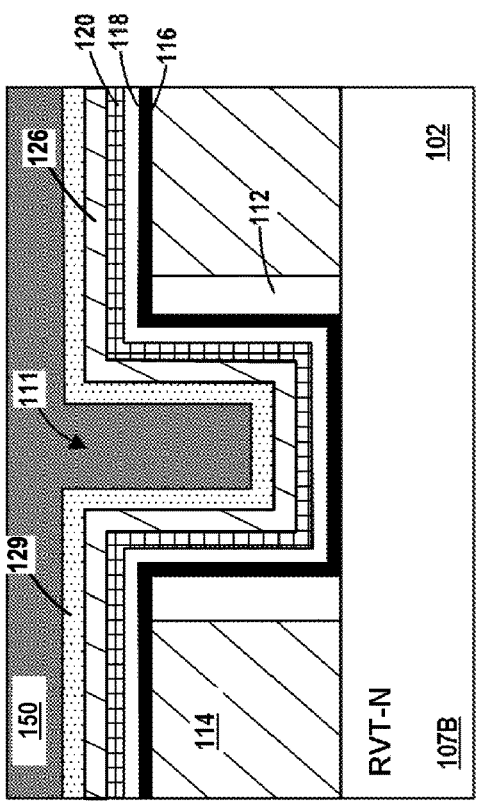
Figure 76:
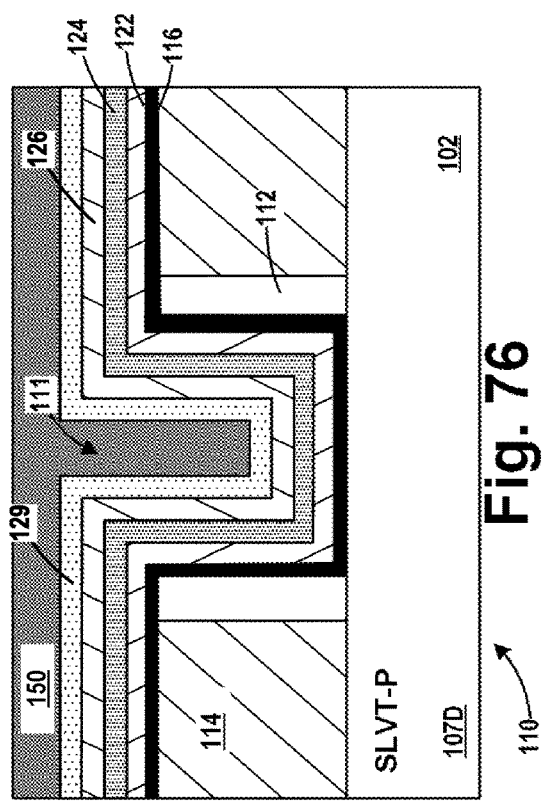
Figure 73:
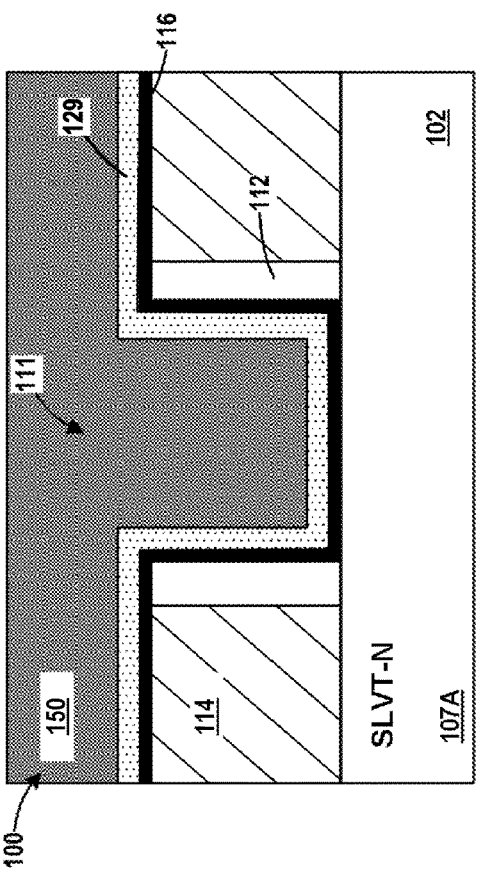
Figure 75:
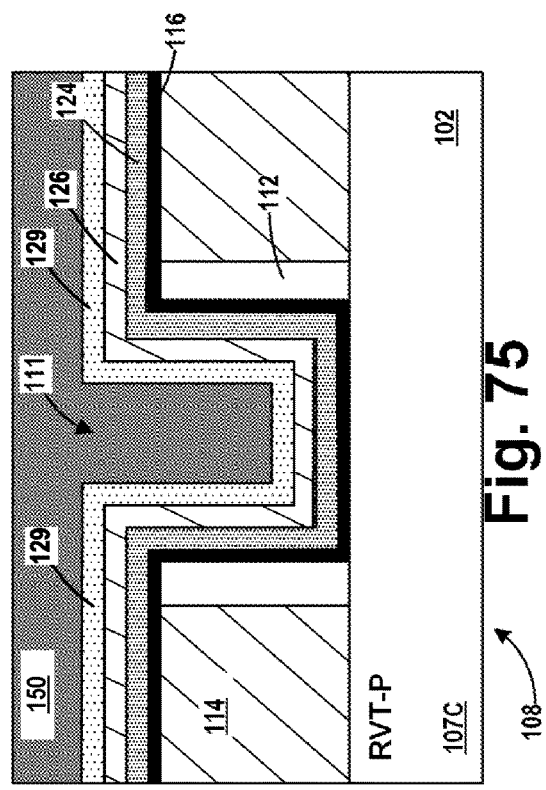
Figure 77:
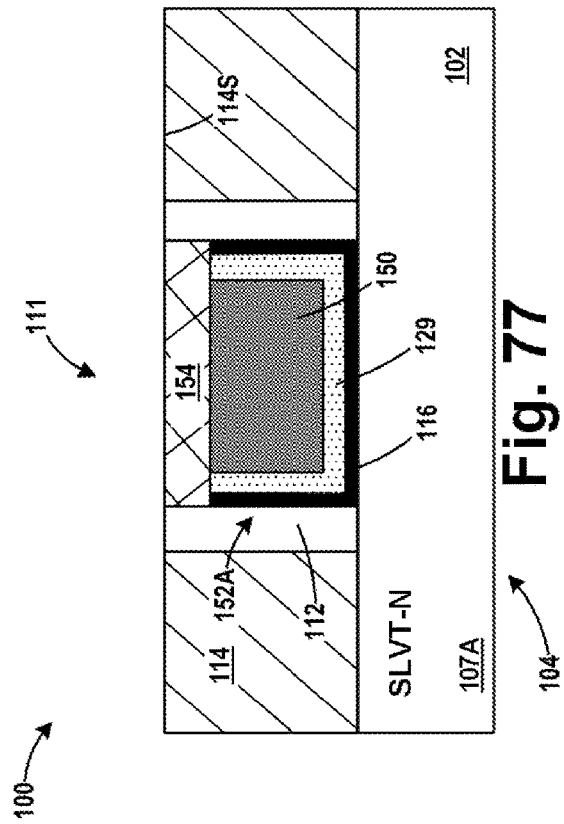
Figure 78:
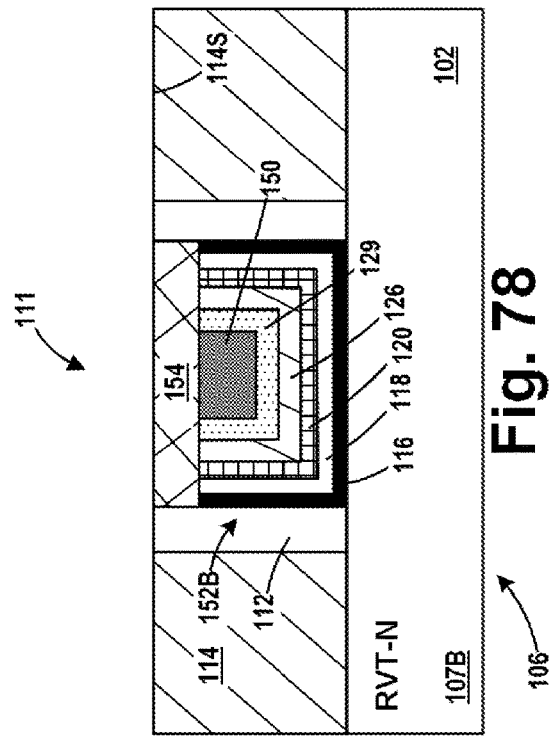
Figure 79:
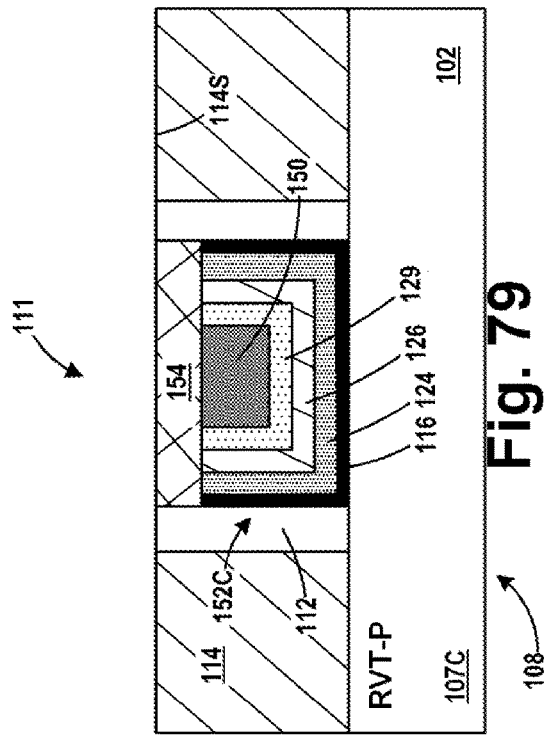

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NFET or PFET devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 80:
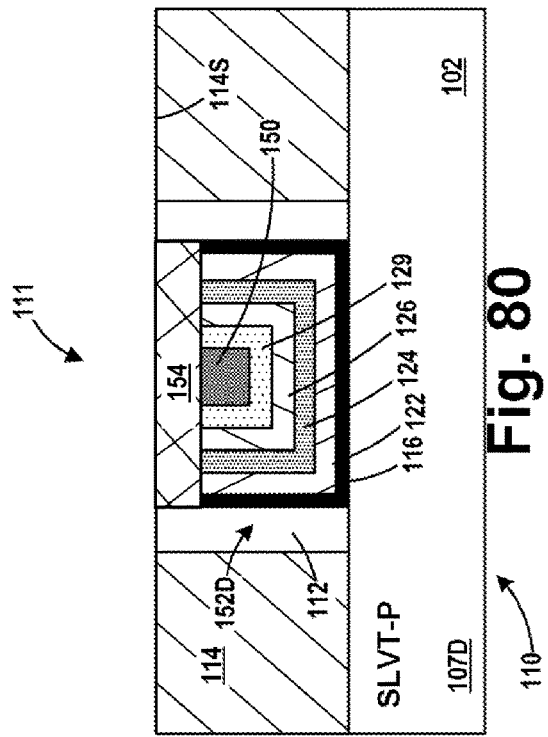

FIGS. 1-80 depict various novel embodiments of a low leakage gate stack for a transistor device and various novel methods of making an IC product 100 that includes such a transistor device. In the depicted example, the IC product 100 comprises four different transistor devices 104, 106, 108 and 110—each having a different threshold voltage (Vt). The IC product 100 will be formed on and above a semiconductor substrate 102. The semiconductor substrate 102 may have a variety of configurations, such as a bulk silicon configuration. The substrate 102 may also have a semiconductor-on-insulator (SOI) configuration that includes a base semiconductor layer, a buried insulation layer and an active semiconductor layer positioned above the buried insulation layer, wherein transistor devices (not shown) that are formed on the substrate are formed in and above the active semiconductor layer. The substrate 102 may be made of silicon or it may be made of materials other than silicon. Thus, the terms "substrate" or "semiconductor substrate" should be understood to cover all semiconducting materials and all forms of such materials.

As will be appreciated by those skilled in the art after a complete reading of the present application, the novel stack of gate materials disclosed herein may be formed on either an NFET or PFET device. Moreover, the transistor devices disclosed herein may have any configuration, e.g., FinFET devices, planar devices, vertical devices, etc. The gate length of the transistor devices need not all be the same, but that may be the case in some applications. For purposes of disclosure, the transistor devices depicted herein are FinFET devices, the gate structure for the transistor devices will be formed using a replacement gate manufacturing technique and the transistors will be depicted as all having substantially the same gate length. However, the presently disclosed subject matter should not be considered to be limited to the illustrative examples depicted herein.

In general, and with reference to FIGS. 1-4, the IC product 100 comprises four different transistor devices 104, 106, 108 and 110—each having a different threshold voltage (Vt). More specifically, the transistor 104 is an N-type SLVT device (SLVT-N), the transistor 106 is an N-type RVT device (RVT-N), the transistor 108 is a P-type RVT device (RVT-P) and the transistor 110 is a P-type SLVT device (SLVT-P). As will be understood by those skilled in the art, the threshold voltage of the SLVT-N transistor 104 is less than the threshold voltage of the RVT-N transistor 106, and the threshold voltage of the SLVT-P transistor 110 is less than the threshold voltage of the RVT-P transistor 108. The absolute value of the threshold voltage of each of these devices, as well as the magnitude of the difference between the threshold voltage levels of each of these devices, may vary depending upon the particular application and upon further advances in device technology and device scaling.

In the example depicted herein, the novel stack of gate materials will be formed on the RVT-N transistor 106. However, as will be understood by those skilled in the art after a complete reading of the present application, the novel stack of gate materials disclosed herein could be formed on any of the transistor devices or it could be formed on two or more of the transistor devices.

The transistor devices 104, 106, 108 and 110 are formed on active regions 107A-D (collectively referenced using the numeral 107), respectively, formed in the substrate 102. The active regions 107 are isolated from one another and other active regions by isolation material (not shown), e.g., silicon dioxide, positioned in trenches formed in the substrate 102. The various transistor devices disclosed herein may be formed immediately adjacent one another on the substrate 102 or they may be formed in different regions or areas of the substrate 102. The gate-length (GL) direction or current-transport direction of the transistors is indicated in FIGS. 1-4. As noted above, the gate length of all of the transistors may be the same or they may have gate lengths of differing dimensions, e.g., some of the transistors may be short-channel devices while other devices may be long-channel devices The example below depicts the formation of four different classes or categories of transistors having different threshold voltages. However, as will be appreciated by those skilled in the art after a complete reading of the present application, the methods disclosed herein may be performed to form any desired number of such classes of transistors. For example, the methods disclosed herein may be performed to form an IC product with just two different classes or categories of transistors having different threshold voltage levels.

As noted above, the gate structures of the various transistor devices 104, 106, 108 and 110 disclosed herein will be formed using replacement-gate manufacturing techniques. Of course, the materials of the final gate structures for N-type transistor devices may be different from the materials of the final gate structures for P-type transistor devices, e.g., they may have different work-function material layers. Additionally, the final gate stack of the transistor devices may have a different number of layers of material, e.g., the gate stack of the SLVT-P transistor 110 may comprise a greater number of layers of material than the gate stack of the SLVT-N transistor 104.

Accordingly, FIGS. 1-4 depict the product 100 at a point in time where sacrificial (or "dummy") gate structures 103, with a sacrificial gate cap 105 formed thereabove, were formed across the substrate 102 for each of the transistors. Also depicted in the drawings is an illustrative and representative layer of insulating material 114, e.g., silicon dioxide. In practice, the layer of insulating material 114 may be comprised of multiple layers of material made from the same or different insulating materials. Of course, there may be other layers of materials and/or components of a real-world transistor device that are not depicted in the drawings, e.g., regions of epi semiconductor material in the source/drain regions of the devices, contact etch-stop layers, doped implant regions, etc.

In one illustrative and non-limiting process flow, each of the sacrificial structures 103 comprises a sacrificial gate insulation layer (e.g., silicon dioxide—not separately shown) and a sacrificial gate electrode material (e.g., polysilicon or amorphous silicon—not separately shown). As noted above, a sacrificial gate cap 105 (e.g., silicon nitride) is positioned above each of the sacrificial gate structures 103. In one illustrative process flow, the sacrificial gate structures 103 (with the gate cap 105 thereabove) are initially formed as continuous line-type structures that extend across substantially the entire substrate 102, i.e., across both active regions and isolation regions located between active regions. The long continuous line-type sacrificial gate structures 103/gate cap 105 structures may be formed by depositing the materials for the sacrificial gate structures 103 as well as a layer of material for the sacrificial gate caps 105 across the entire substrate 102, forming a patterned gate etch mask (not shown) above the deposited layer of the material for the sacrificial gate caps 105, and performing one or more etching processes through the patterned gate etch mask to remove the exposed portions of sacrificial gate cap material and, thereafter, the exposed portions of the sacrificial gate materials. At some point in the process flow, the sacrificial gate structure 103 and sacrificial gate caps 105 will be cut to a desired axial length for each of the transistor devices. When this gate-cut process occurs can vary depending on the particular process flow employed.

In some cases, the gate structures 103 for all of the transistor devices may have the same axial length, but that may not be the case in all applications.

Next, still referencing FIGS. 1-4, an illustrative sidewall spacer structure 112 (e.g., silicon nitride, a low-k material (k value of 3.3 or less), etc.) was formed adjacent the sacrificial gate structures 103 and gate caps 105. The spacer structure 112 may be formed by depositing a conformal layer of spacer material and thereafter performing an anisotropic etching process. In the examples depicted herein, the spacer structure 112 is depicted as a single sidewall spacer. In practice, the spacer structure 112 may be comprised of a plurality of sidewall spacers that may or may not be comprised of different materials.

Various process operations are typically performed with the sacrificial gate structures 103, gate caps 105 and spacer structures 112 in position, e.g., source/drain implantation processes, the formation of epi semiconductor material (not shown) in the source/drain regions of the transistors, etc. Then, a conformal contact etch-stop layer (not shown, e.g., silicon nitride) may be formed on the product 100 and above the regions of epi semiconductor material. At that point, one or more layers of insulating material 114 (e.g., silicon dioxide) was formed across the product 100 so as to over-fill the open spaces between the spacer structures 112. Thereafter, a chemical mechanical planarization (CMP) and/or etch-back process was performed to planarize the upper surface of the layer of insulating material 114 with the upper surface of the sacrificial gate caps 105.

FIGS. 5-8 depict the product 100 after various process operations were performed to remove the sacrificial gate structures 103 so as to form a replacement gate cavity 111 for each of the devices 104, 106, 108 and 110. More specifically, in one illustrative process flow, one or more CMP process operations were performed to remove the sacrificial gate caps 105 and portions of the insulating material 114. This process operation exposes the underlying sacrificial gate structures 103. At that point, at least the sacrificial gate electrode portion of the sacrificial gate structures 103 was removed so as to form the plurality of replacement gate cavities 111 that are located laterally between the spacers 112. In some cases, the entirety of the sacrificial gate structures 103 may be removed so as to expose the upper surface 102S of the substrate 102 within the replacement gate cavities 111. In the case where the transistor devices are FinFET devices, the surface 102S would be the upper surface of a fin.

The present subject matter generally involves, among other things, the formation of various conformal layers of conductive material in the replacement gate cavities 111 of all of the different transistor devices. The methods disclosed below also involve the selective removal of portions of certain of the one or more conformal layers of conductive material from within the gate cavity 111 of one or more of the transistor devices while leaving other portions of the conformal layers of conductive material in the gate cavity 111 of one or more of the transistor devices. In general, the conformal layers of conductive material have a generally U-shaped configuration when viewed in a cross-section taken through these materials in a direction corresponding to the gate length (GL) direction of the transistor devices. The conformal layers of conductive material may be formed to any desired thickness and they may be formed by performing any type of conformal deposition process, e.g., a conformal ALD process.

FIGS. 9-12 depict the product 100 after a conformal high-k (k value of 10 or greater) gate insulation layer 116 was formed in the replacement gate cavity 111 of each of the devices 104, 106, 108 and 110. In some applications, the high-k gate insulation layer 116 may be formed on and in physical contact with the upper surface 102S of the substrate 102. In other cases, a thin interfacial oxide layer (not shown) may be formed on the surface 102S of the substrate 102 prior to the formation of the high-k gate insulation layer 116. The high-k gate insulation layer 116 may be formed to any desired thickness and it may comprise a variety of different materials, e.g., tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$), etc. Although the high-k gate insulation layer 116 depicted herein is shown as a single layer of material, in some applications, multiple conformal gate insulation layers may be formed in each of the replacement gate cavities 111.

FIGS. 13-16 depict the product 100 after a conformal deposition process was performed to form a first TiN (titanium nitride) layer 118 above the high-k gate insulation layer 116 in the replacement gate cavities 111 of each of the devices 104, 106, 108 and 110. In one illustrative example, the first TiN layer 118 may be formed on and in physical contact with the high-k gate insulation layer 116. The first TiN layer 118 may be formed to any desired thickness, e.g., 1-10 nm, and it may be formed by performing any type of conformal deposition process, e.g., a conformal ALD process.

FIGS. 17-20 depict the product 100 after a layer of silicon-containing material 119 was formed above the IC product 100 and in the replacement gate cavities 111 of each of the devices 104, 106, 108 and 110. The layer of silicon-containing material 119 may be comprised of a variety of different silicon-containing materials, e.g., amorphous silicon, polysilicon, etc. In one illustrative embodiment, the layer of silicon-containing material 119 may be substantially free of any dopant materials. In one illustrative example, the layer of silicon-containing material 119 may be formed on and in physical contact with the first TiN layer 118. The layer of silicon-containing material 119 may be formed to any desired thickness, and it may be formed by performing a blanket deposition process, e.g., a CVD process.

FIGS. 21-24 depict the product 100 after one or more heating or anneal processes were performed on the product 100. The temperature and duration of the one or more heating or anneal processes may vary depending upon the particular application. In one illustrative example, an RTA (rapid thermal anneal) process was performed on the product 100 followed by performing an LSA (laser spike anneal) process on the product 100. The temperatures and durations of the RTA and LSA anneal processes may vary depending upon the particular application, In one particular example, based upon current-day technology, the RTA process may be performed at a temperature of about 900-1100° C. for a duration of about 0.1-30 seconds. In one particular example, based upon current-day technology, the LSA process may be performed at a temperature of about 1100-1250° C. for a duration of about 0.1-100 milliseconds.

With continued reference to FIGS. 21-24, performing the one or more heating or anneal processes causes silicon to migrate or diffuse from the layer of silicon-containing material 119 to combine with material from the first TiN layer 118 so as to form a TiSiN (titanium silicon nitride) layer 120 on the first TiN layer 118. The thickness of the original first TiN layer 118 may be reduced during this process as part of the first TiN layer 118 is converted to the TiSiN layer 120. The TiSiN layer 120 may be formed to any desired thickness, e.g., 1-30 nm. The thickness of the TiSiN layer 120 may be controlled by controlling the temperature and/or duration of the one or more heating or anneal processes performed on the product 100.

FIGS. 25-28 depict the product 100 after several process operations were performed. First, the layer of silicon-containing material 119 was removed selectively relative to the surrounding materials. Next, a first patterned etch mask 130, e.g., a patterned layer of photoresist/BARC, was formed on the product 100 by performing traditional manufacturing techniques. The first patterned etch mask 130 covers the SLVT-N transistor 104, the RVT-N transistor 106 and the RVT-P transistor 108 while leaving the SLVT-P transistor 110 exposed for further processing.

FIGS. 29-32 depict the product 100 after one or more etching processes were performed to remove the first TiN layer 118 and the TiSiN layer 120 on the SLVT-P transistor 110. This process operation exposes the high-k gate insulation layer 116 within the gate cavity 111 on the SLVT-P transistor 110.

FIGS. 33-36 depict the product 100 after several process operations were performed. First, the first patterned etch mask 130 was removed. Next, a conformal deposition process was performed to form a second TiN (titanium nitride) layer 122 in the replacement gate cavity 111 of each of the devices 104, 106, 108 and 110. Note that, for the SLVT-P transistor 110, the second TiN layer 122 may be formed on and in physical contact with the high-k gate insulation layer 116. However, for the SLVT-N transistor 104, the RVT-N transistor 106 and the RVT-P transistor 108, the second TiN layer 122 may be formed above the TiSiN layer 120. The second TiN layer 122 may be formed to any desired thickness, e.g., 1-30 nm, and it may be formed by performing any type of conformal deposition process, e.g., a conformal ALD process.

FIGS. 37-40 depict the product 100 after a second patterned etch mask 132, e.g., a patterned layer of photoresist/BARC, was formed on the product 100 by performing traditional manufacturing techniques. The second patterned etch mask 132 covers the SLVT-P transistor 110 while leaving the SLVT-N transistor 104, the RVT-N transistor 106 and the RVT-P transistor 108 exposed for further processing.

FIGS. 41-44 depict the product 100 after one or more etching processes were performed to remove the second TiN layer 122 on the SLVT-N transistor 104, the RVT-N transistor 106 and the RVT-P transistor 108. This process operation exposes the TiSiN layer 120 within the gate cavity 111 on each of the SLVT-N transistor 104, the RVT-N transistor 106 and the RVT-P transistor 108.

FIGS. 45-48 depict the product 100 after several process operations were performed. First, the second patterned etch mask 132 was removed. Next, a third patterned etch mask 134, e.g., a patterned layer of photoresist/BARC, was formed on the product 100 by performing traditional manufacturing techniques. The third patterned etch mask 134 covers the SLVT-N transistor 104, the RVT-N transistor 106 and the SLVT-P transistor 110 while leaving the RVT-P transistor 108 exposed for further processing. Thereafter, one or more etching processes were performed to remove the first TiN layer 118 and the TiSiN layer 120 on the RVT-P transistor 108. This process operation exposes the high-k gate insulation layer 116 within the gate cavity 111 on the RVT-P transistor 108.

FIGS. 49-52 depict the product 100 after several process operations were performed. First, the third patterned etch mask 134 was removed. Next, a conformal deposition process was performed to form a third TiN (titanium nitride) layer 124 in the replacement gate cavity 111 of each of the devices 104, 106, 108 and 110. Note that, for the RVT-P transistor 108, the third TiN layer 124 may be formed on and in physical contact with the high-k gate insulation layer 116. However, for the SLVT-N transistor 104 and the RVT-N transistor 106, the third TiN layer 124 may be formed on and in physical contact with the remaining portions of the TiSiN layer 120. For the SLVT-P transistor 110, the third TiN layer 124 may be formed on the second TiN layer 122. The third TiN layer 124 may be formed to any desired thickness, e.g., 1-30 nm, and it may be formed by performing any type of conformal deposition process, e.g., a conformal ALD process.

FIGS. 53-56 depict the product 100 after a fourth patterned etch mask 136, e.g., a patterned layer of photoresist/BARC, was formed on the product 100 by performing traditional manufacturing techniques. The fourth patterned etch mask 136 covers the SLVT-N transistor 104, the RVT-P transistor 108 and the SLVT-P transistor 110 while leaving the RVT-N transistor 106 exposed for further processing.

FIGS. 57-60 depict the product 100 after one or more etching processes were performed to remove the third TiN layer 124 on the RVT-N transistor 106. This process operation exposes the TiSiN layer 120 within the gate cavity 111 on the RVT-N transistor 106.

FIGS. 61-64 depict the product 100 after several process operations were performed. First, the fourth patterned etch mask 136 was removed. Next, a conformal deposition process was performed to form a fourth TiN (titanium nitride) layer 126 in the replacement gate cavity 111 of each of the devices 104, 106, 108 and 110. Note that, for the RVT-N transistor 106, the fourth TiN layer 126 may be formed on and in physical contact with the TiSiN layer 120. For the SLVT-N transistor 104, the RVT-P transistor 108 and the SLVT-P transistor 110, the fourth TiN layer 126 may be formed on and in physical contact with the third TiN layer 124. The fourth TiN layer 126 may be formed to any desired thickness, e.g., 1-30 nm, and it may be formed by performing any type of conformal deposition process, e.g., a conformal ALD process.

FIGS. 65-68 depict the product 100 after a fifth patterned etch mask 138, e.g., a patterned layer of photoresist/BARC, was formed on the product 100 by performing traditional manufacturing techniques. The fifth patterned etch mask 138 covers the RVT-N transistor 106, the RVT-P transistor 108 and the SLVT-P transistor 110 while leaving the SLVT-N transistor 104 exposed for further processing.

FIGS. 69-72 depict the product 100 after one or more etching processes were performed to remove the fourth TiN layer 126, the third TiN layer 124, the TiSiN layer 120 and the first TiN layer 118 on the SLVT-N transistor 104. This process operation exposes the high-k gate insulation layer 116 within the gate cavity 111 on the SLVT-N transistor 104.

FIGS. 73-76 depict the product 100 after several process operations were performed. First, the fifth patterned etch mask 138 was removed. Next, a conformal deposition process was performed to form at least one N-type work function adjusting material layer 129 in the replacement gate cavity 111 of each of the devices 104, 106, 108 and 110. Although the N-type work function adjusting material layer 129 is simplistically depicted herein as a single layer of material, in practice, the N-type work function adjusting material layer 129 may comprise multiple layers of material, e.g., a tri-layer comprising TiN/TiAlC/TiN. The N-type work function adjusting material layer(s) 129 may be comprised of other materials as well, e.g., titanium carbide (TiC), titanium aluminide (TiAl), tantalum aluminide (TaAl$_3$), hafnium aluminide (HfAl or HfAl$_3$), a metal silicide, etc. The N-type work function adjusting material layer(s) 129 may be formed to any desired thickness, e.g., 5-50 nm, and it or they may be formed by performing any type of conformal deposition process, e.g., a conformal ALD process.

With continuing reference to FIGS. 73-76, the next process operation involves performing a conformal deposition process to form at least one P-type work function adjusting material layer (not shown) in the replacement gate cavity 111 of each of the devices 104, 106, 108 and 110. Thereafter, the at least one P-type work function adjusting material layer was removed from the SLVT-N transistor 104 and the RVT-N transistor 106 by performing known masking and etching techniques similar to those described above. The P-type work function adjusting material layer(s) may be comprised of other materials as well, e.g., TiN, TiLaN, TiSiN, etc. The P-type work function adjusting material layer(s) may be formed to any desired thickness, e.g., 1-50 nm, and it or they may be formed by performing any type of conformal deposition process, e.g., a conformal ALD process. Next, an illustrative bulk conductive material 150 was blanket deposited across the product 100 so as to over-fill the remaining un-filled portions of the replacement gate cavities 111. The bulk conductive material 150 may be comprised of a variety of different materials including, but not limited to, tungsten, cobalt, etc.

FIGS. 77-80 depict the product 100 after several process operations were performed. First, one or more CMP process and/or etch-back process operations were performed to remove portions of all of the layers of material positioned outside of the gate cavities 111 and above the upper surface 114S of the layer of insulating material 114. These operations result in the formation of the final gate structures 152A-D (collectively referenced using the numeral 152) for the transistor devices 104, 106, 108 and 110, respectively. Then, a recess etching process was performed to remove some of the vertical thickness of the various materials of the gate structures 152 within the gate cavities 111 so as to make room for the final gate cap 154 that will be formed above the recessed materials of the gate structures 152 within the gate cavities 111. The amount of recessing of the materials of the gate structures 152 within the gate cavities 111 may vary depending upon the particular application. At that point, a layer of final gate cap material (e.g., silicon nitride) may be deposited across the product 100 so as to over-fill the remaining portions of the replacement gate cavities 111 above the recessed materials of the gate structures 152 within the gate cavities 111. Then, another CMP process operation may be performed to remove portions of the layer of final gate cap material positioned outside of the gate cavities 111 and above the upper surface 114S of the layer of insulating material 114 so as to thereby form the final gate caps 154 between the spacer structures 112.

As will be appreciated by those skilled in the art after a complete reading of the present application, the TiSiN layer 120 is only present in the final gate structure 152B of the RVT-N device 106, i.e., the remaining gate structures 152A, 152C and 152D are free of any TiSiN material. The purpose of the TiSiN layer 120 was to protect the underlying high-k gate insulation layer 116 of the RVT-N device 106 during the various etching processes performed above. The inventors have determined that on-state gate leakage currents (Igon) is a relatively large component of the combination of on-state leakage currents (Igon) and off-state leakage currents (Idoff) for RVT devices. More specifically, on-state gate leakage currents (Igon) may be about 15% of the RVT ring oscillator leakage. This is particularly important in mobile applications where IC products for such mobile applications typically contain a relatively large number of RVT devices. Testing performed by the inventors has shown a significant reduction in on-state leakage currents for an N-type RVT device using the novel gate structure 152B disclosed herein, e.g., the gate leakage current was reduced by about 20-90% as compared to other N-type RVT devices without the novel gate structure disclosed herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. An integrated circuit (IC) product, comprising:
   a semiconductor substrate;
   a first transistor device formed on the semiconductor substrate, the first transistor device comprising a first gate structure, wherein the first gate structure comprises:
      a gate insulation layer;
      a first layer of titanium nitride (TiN) positioned above the gate insulation layer;
      a layer of titanium silicon nitride (TiSiN) positioned above the first layer of TiN; and
      a second layer of titanium nitride (TiN) positioned above the layer of TiSiN; and
   a plurality of additional transistor devices on the semiconductor substrate and devoid of any titanium silicon nitride (TiSiN) material, wherein a threshold voltage of at least one of the plurality of additional transistor devices is different from a threshold voltage of the first transistor device, and wherein at least two of the plurality of additional transistor devices have different threshold voltages.

2. The IC product of claim 1, wherein the gate insulation layer comprises a high-k gate insulation layer.

3. The IC product of claim 1, wherein the first layer of TiN is positioned on and in physical contact with the gate insulation layer, the layer of TiSiN is positioned on and in physical contact with the first layer of TiN and the second layer of TiN is positioned on and in physical contact with the layer of TiSiN.

4. The IC product of claim 1, wherein the at least one of the plurality of additional transistor devices includes a second transistor formed on the semiconductor substrate, the second transistor device comprising a second gate structure, wherein the second gate structure is devoid of any titanium silicon nitride (TiSiN) material.

5. The IC product of claim 4, wherein the first transistor has a first threshold voltage and the second transistor has a second threshold voltage, wherein the second threshold voltage is less than the first threshold voltage.

6. The IC product of claim 4, wherein the first gate structure further comprises:
   at least one layer of work function adjusting material positioned above the second layer of TiN; and
   a bulk conductive material positioned above the at least one layer of work function adjusting material of the first gate structure.

7. The IC product of claim 6, wherein the second gate structure further comprises:
   a second gate insulation layer;
   at least one layer of work function adjusting material positioned on and in physical contact with the second gate insulation layer; and
   a bulk conductive material positioned on and in physical contact with the at least one layer of work function adjusting material of the second gate structure.

8. The IC product of claim 4, wherein the plurality of additional transistor devices further includes:
   a third transistor formed on the semiconductor substrate, the third transistor device comprising a third gate structure, wherein the third gate structure is devoid of any titanium silicon nitride (TiSiN) material; and
   a fourth transistor formed on the semiconductor substrate, the fourth transistor device comprising a fourth gate structure, wherein the fourth gate structure is devoid of any titanium silicon nitride (TiSiN) material.

9. The IC product of claim 8, wherein the first and second transistors are N-type transistors, the third and fourth transistors are P-type transistors, wherein the third transistor has a third threshold voltage and the fourth transistor has a fourth threshold voltage, wherein the fourth threshold voltage is less than the third threshold voltage.

10. The IC product of claim 1, wherein the first transistor is an N-type FinFET device.

11. An integrated circuit (IC) product, comprising:
    a semiconductor substrate; and
    a first transistor device with a first threshold voltage formed on the semiconductor substrate, the first transistor device comprising a first gate structure, wherein the first gate structure comprises:
       a first high-k gate insulation layer;
       a first layer of titanium nitride (TiN) positioned on and in physical contact with the first high-k gate insulation layer;
       a layer of titanium silicon nitride (TiSiN) positioned on and in physical contact with the first layer of TiN; and
       a second layer of titanium nitride (TiN) positioned on and in physical contact with the layer of TiSiN;
    a second transistor with a second threshold voltage formed on the semiconductor substrate, the second transistor device comprising a second gate structure, wherein the second gate structure is devoid of any titanium silicon nitride (TiSiN) material and wherein the second threshold voltage is less than the first threshold voltage;
    a third transistor formed on the semiconductor substrate, the third transistor device comprising a third gate structure, wherein the third gate structure is devoid of any titanium silicon nitride (TiSiN) material; and
    a fourth transistor formed on the semiconductor substrate, the fourth transistor device comprising a fourth gate structure, wherein the fourth gate structure is devoid of any titanium silicon nitride (TiSiN) material,
    wherein the first and second transistors are N-type transistors, the third and fourth transistors are P-type transistors, wherein the third transistor has a third threshold voltage and the fourth transistor has a fourth threshold voltage, wherein the fourth threshold voltage is less than the third threshold voltage.

12. The IC product of claim 11, wherein the first gate structure further comprises:
   at least one layer of work function adjusting material positioned on and in physical contact with the second layer of TiN; and
   a bulk conductive material positioned on and in physical contact with the at least one layer of work function adjusting material of the first gate structure; and
   wherein the second gate structure further comprises:
   a second high-k gate insulation layer;
   at least one layer of work function adjusting material positioned on and in physical contact with the second high-k gate insulation layer; and
   a bulk conductive material positioned on and in physical contact with the at least one layer of work function adjusting material of the second gate structure.

13. The IC product of claim 12, wherein a thickness of the at least one layer of work function adjusting material is between approximately five nanometers (nm) and approximately fifty nm.

14. A method of forming an integrated circuit (IC) product, the method comprising:
   forming a first gate structure for a first transistor device, wherein forming the first gate structure comprises:
      forming a high-k gate insulation layer above an upper surface of a semiconductor substrate;
      forming a first layer of titanium nitride (TiN) on the high-k gate insulation layer;
      forming a layer of titanium silicon nitride (TiSiN) on the first layer of TiN by heating a layer of silicon-containing material on the first layer of TiN to yield TiSiN between the first layer of TiN and the layer of silicon-containing material; and
      forming a second layer of titanium nitride (TiN) on the layer of TiSiN.

15. The method of forming the IC product of claim 14, further comprising removing the layer of silicon-containing material.

16. The method of forming the IC product of claim 14, wherein forming the first layer of TiN comprises forming the first layer of TiN such that it is positioned on and in physical contact with the high-k gate insulation layer, forming the layer of TiSiN comprises forming the layer of TiSiN such that it is positioned on and in physical contact with the first layer of TiN and forming the second layer of TiN comprises forming the second layer of TiN such that it is positioned on and in physical contact with the layer of TiSiN.

17. The method of forming the IC product of claim 14, further comprising forming a second transistor on the semiconductor substrate, wherein the second transistor device comprises a second gate structure that is devoid of any titanium silicon nitride (TiSiN) material.

18. The method of forming the IC product of claim 17, wherein first transistor has a first threshold voltage and the second transistor has a second threshold voltage, wherein the second threshold voltage is less than the first threshold voltage.

19. The method of forming the IC product of claim 14, wherein forming the first gate structure further comprises:
   forming at least one layer of work function adjusting material above the second layer of TiN; and
   forming a bulk conductive material above the at least one layer of work function adjusting material of the first gate structure.

20. The method of forming the IC product of claim 19, wherein the at least one layer of work function adjusting material includes forming a TiN/TiALC/TiN tri-layer.

* * * * *